(12) United States Patent
Shoji

(10) Patent No.: US 7,248,045 B2
(45) Date of Patent: Jul. 24, 2007

(54) MAGNETIC SENSING DEVICE, METHOD OF FORMING THE SAME, MAGNETIC SENSOR, AND AMMETER

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 61 days.

(21) Appl. No.: 11/042,094

(22) Filed: Jan. 26, 2005

(65) Prior Publication Data

US 2005/0185346 A1 Aug. 25, 2005

(30) Foreign Application Priority Data

Feb. 20, 2004 (JP) ............................ 2004-045110

(51) Int. Cl.
*G01R 33/02* (2006.01)

(52) U.S. Cl. ..................................... 324/252

(58) Field of Classification Search ...................... None
See application file for complete search history.

(56) References Cited

U.S. PATENT DOCUMENTS

| | | | |
|---|---|---|---|
| 5,159,513 A | 10/1992 | Dieny et al. | |
| 5,206,590 A | 4/1993 | Dieny et al. | |
| 5,549,978 A | 8/1996 | Iwasaki et al. | |
| 6,124,711 A * | 9/2000 | Tanaka et al. | 324/252 |
| 6,329,818 B1 * | 12/2001 | Tokunaga et al. | 324/252 |
| 6,436,526 B1 * | 8/2002 | Odagawa et al. | 428/332 |
| 6,465,053 B1 * | 10/2002 | Lenssen et al. | 427/548 |
| 6,639,291 B1 | 10/2003 | Sin et al. | |
| 6,865,109 B2 * | 3/2005 | Covington | 365/173 |
| 7,018,725 B2 * | 3/2006 | Odagawa et al. | 257/E21.665 |
| 7,020,009 B2 * | 3/2006 | Ho et al. | 365/158 |
| 2002/0146580 A1 | 10/2002 | Wang et al. | |
| 2002/0181164 A1 | 12/2002 | Macken et al. | |
| 2004/0023065 A1 | 2/2004 | Daughton et al. | |
| 2006/0002031 A1 * | 1/2006 | Shoji | 360/313 |
| 2006/0071655 A1 * | 4/2006 | Shoji | 324/117 H |

(Continued)

FOREIGN PATENT DOCUMENTS

EP 0 490 608 A2 6/1992

(Continued)

*Primary Examiner*—Ha Tran Nguyen
*Assistant Examiner*—Richard Isla-Rodas
(74) *Attorney, Agent, or Firm*—Oliff & Berridge, PLC

(57) ABSTRACT

The present invention provides a magnetic sensing device capable of stably sensing a signal magnetic field with high sensitivity by suppressing occurrence of a hysteresis to reduce 1/f noise. A magnetic sensing device has a stacked body including a pinned layer having a magnetization direction pinned to a predetermined direction (Y direction), a free layer having a magnetization direction which changes according to an external magnetic field and, when the external magnetic field is zero, becomes parallel to the magnetization direction of the pinned layer, and an intermediate layer sandwiched between the pinned layer and the free layer. Consequently, as compared with the case where the pinned layer and the free layer have magnetization directions which are orthogonal to each other when the external magnetic field is zero, variations in the spin directions of magnetic domains in the free layer can be reduced. In the case of passing read current, appearance of a hysteresis in the relation between a change in the external magnetic field and a resistance change can be suppressed. As a result, 1/f noise is suppressed and a signal magnetic field can be stably sensed with high sensitivity.

19 Claims, 18 Drawing Sheets

U.S. PATENT DOCUMENTS

2006/0291106 A1* 12/2006 Shoji .................... 360/324.11

FOREIGN PATENT DOCUMENTS

| EP | 0 498 668 A2 | 8/1992 |
| EP | 1 227 526 A2 | 7/2002 |
| EP | 1 306 687 A2 | 5/2003 |
| JP | A 09-508214 | 8/1997 |
| WO | WO 96/16316 | 5/1996 |
| WO | WO 03/054523 A2 | 7/2003 |

* cited by examiner

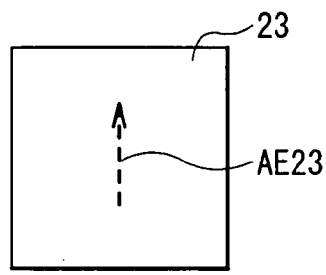 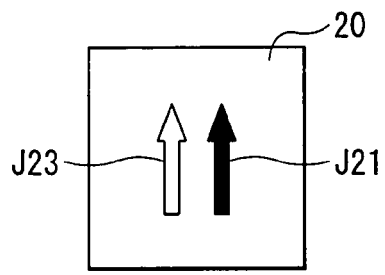
FIG. 8A    FIG. 8B
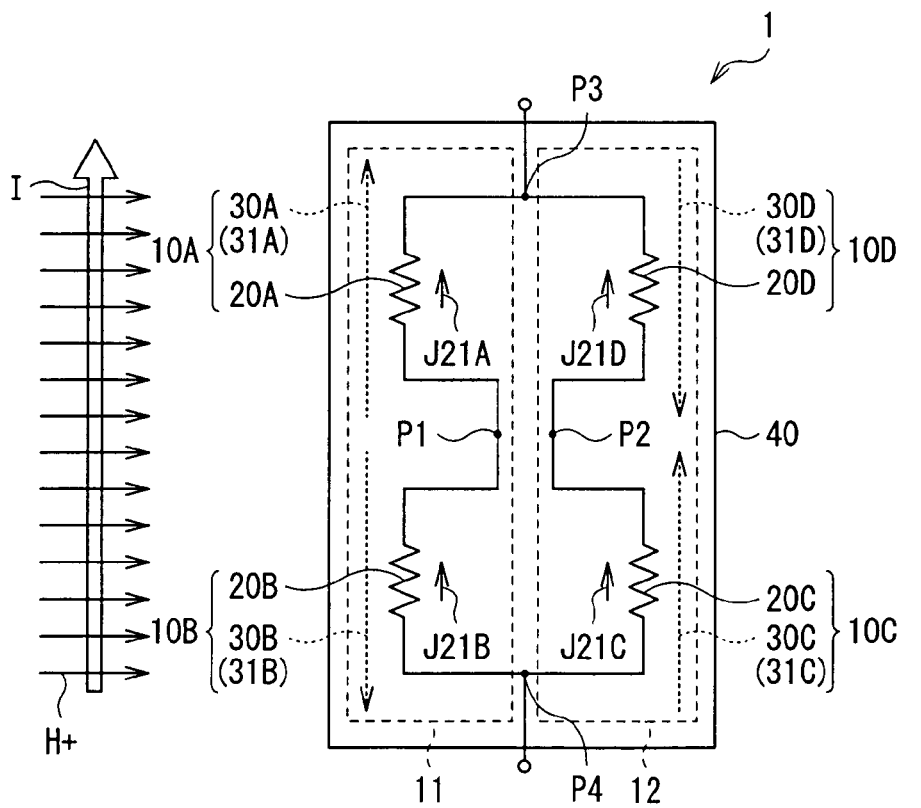
FIG. 9

MAGNETIC SENSING DEVICE, METHOD OF FORMING THE SAME, MAGNETIC SENSOR, AND AMMETER

BACKGROUND OF THE INVENTION

1. Field of the Invention

The present invention relates to a magnetic sensing device capable of sensing a change in a signal magnetic field at high sensitivity, method of forming the same, a magnetic sensor having the magnetic sensing device, and an ammeter having the magnetic sensing device.

2. Description of the Related Art

Generally, a magnetic recording/reproducing apparatus for writing/reading magnetic information to/from a recording medium such as a hard disk has a thin film magnetic head including a magnetic recording head and a magnetic reproducing head. The reproducing head has a giant magneto-resistive effect element (hereinbelow, GMR element) executing reproduction of a digital signal as magnetic information by using so-called giant magneto-resistive effect.

The GMR element used for a thin film magnetic head generally has a spin valve structure as shown in FIG. 19. Concretely, the GMR element is a stacked body 120 including a pinned layer 121 whose magnetization direction is pinned in a predetermined direction, a free layer 123 whose magnetization direction changes according to an external magnetic field, and an intermediate layer 122 sandwiched between the pinned layer 121 and the free layer 123 (refer to, for example, U.S. Pat. Nos. 5,159,513 and 5,206,590). Each of the top face (the face on the side opposite to the intermediate layer 122) of the pinned layer 121 and the under face (the face on the side opposite to the intermediate layer 122) of the free layer 123 is protected with a not-shown protection layer. In the pinned layer 121, specifically, as shown in FIG. 20 for example, a magnetization pinned film 124 and an antiferromagnetic film 125 are stacked in order from the side of the intermediate layer 122. The magnetization pinned film 124 may be a single layer or a synthetic layer in which a ferromagnetic layer 141, an exchange coupling film 142, and a ferromagnetic layer 143 are formed in order from the side of the intermediate layer 122 as shown in FIG. 21. The free layer 123 may be a single layer or may have a configuration that, for example as shown in FIG. 22, a ferromagnetic film 131, an intermediate film 132, and a ferromagnetic film 133 are formed in order from the side of the intermediate layer 122 and the ferromagnetic films 131 and 133 are exchange-coupled. Such a spin valve structure is formed by a method of sputtering, vacuum deposition, or the like.

The materials and the like of the pinned layer and the free layer in the GMR element used for a thin film magnetic head are disclosed in, for example, U.S. Pat. No. 5,549,978. The material of the intermediate layer sandwiched by the pinned layer and the free layer is generally, for example, copper (Cu). A GMR element capable of using so-called tunnel effect obtained by making a very thin intermediate layer (tunnel barrier layer) of an insulating material such as aluminum oxide ($Al_2O_3$) in place of copper was also developed.

In the GMR element used for a thin film magnetic head, the magnetization direction of the free layer freely changes according to a signal magnetic field generated from a magnetic recording medium. At the time of reading magnetic information recorded on a magnetic recording medium, for example, read current is passed along a stacked-body in-plane direction to the GMR element. At this time, the read current displays an electric resistance value which varies according to the state of the magnetization direction of the free layer. Consequently, a change in the signal magnetic field generated from the recording medium is detected as a change in electric resistance.

This phenomenon will be described in more detail by referring to FIGS. 23A and 23B. FIGS. 23A and 23B show the relation between the magnetization directions of the pinned layer 121 and free layer 123 and the electric resistance of the read current in the spin valve structure. The magnetization direction of the pinned layer 121 is indicated by reference numeral J121 and that of the free layer 123 is indicated by reference numeral J123. FIG. 23A shows a state where the magnetization directions of the pinned layer 121 and the free layer 123 are parallel to each other, and FIG. 23B shows a state where the magnetization directions of the pinned layer 121 and the free layer 123 are anti-parallel to each other. In FIGS. 23A and 23B, in the case of passing read current in the stacked-body in-plane direction, it is estimated that the read current flows mainly in the intermediate layer 122 having high electric conductivity. Electrons "e" flowing in the intermediate layer 122 are subjected to either scattering (which contributes to increase in electric resistance) or mirror-reflection (which does not contribute to increase in electric resistance) in an interface K123 with the free layer 123 and an interface K121 with the pinned layer 121. In the case where the magnetization directions J121 and J123 are parallel to each other as shown in FIG. 23A, the electrons "e" having spins Se parallel to the directions are not so scattered by the interfaces K121 and K123 and relatively low electric resistance is displayed. However, in the case where the magnetization directions J121 and J123 are anti-parallel to each other as shown in FIG. 23B, the electrons "e" are easily scattered by the interface K121 or K123 and relatively high electric resistance is displayed. FIG. 23B shows a state where the electron "e" having the spin Se to the right side of the drawing sheet is scattered by the interface K123 with the free layer 123. As described above, in the GMR element having the spin valve structure, electric resistance of the read current changes according to the angle of the magnetization direction J123 with respect to the magnetization direction J121. Since the magnetization direction J123 is determined by the external magnetic field, as a result, a change in the signal magnetic field from a recording medium can be detected as a resistance change in the read current.

Usually, a GMR element having the spin valve structure is constructed so that the magnetization direction of the free film (free layer) and that of the magnetization pinned film (pinned layer) are orthogonal to each other when an external magnetic field is not applied (H=0). The direction of the easy axis of magnetization of the free layer is set to be the same as the magnetization direction of the pinned layer. The GMR element with such a configuration is disposed so that the magnetization direction of the pinned layer is parallel to the direction of application of the external magnetic field. In such a manner, the center point of an operation range of the magnetization direction in the free layer can be set to the state where no external magnetic field is applied (H=0). That is, the state where the external magnetic field is zero can be set to the center of an amplitude of electric resistance which can be changed by a change in the external magnetic field. Consequently, it is unnecessary to apply a bias magnetic field to the GMR element.

The above will be concretely described with reference to FIGS. 24A to 24C and FIG. 25. FIGS. 24A to 24C show a state where magnetic information on a recording medium is read by a thin film magnetic head on which the GMR element is mounted in a general hard disk drive. As shown in FIG. 24A, the GMR element 120 is disposed close to the recording face 110 of a recording medium so that the magnetization direction J121 of the pinned layer 121 is the +Y direction along the direction (Y axis direction) orthogonal to the recording face 110 of the recording medium and the magnetization direction J123 of the free layer 123 is the +X direction along the direction (X axis direction) of the track width of the recording medium. It is assumed that there is no influence of the signal magnetic field from the recording medium at this time point. When the hard disk drive is driven and, for example as shown in FIG. 24B, a magnetic field in a signal magnetic filed direction J110 in the −Y direction is generated from a recording medium, the magnetization direction J123 becomes the −Y direction which is the opposite to the magnetization direction J121. Therefore, the resistance value of the read current increases as described with reference to FIGS. 23A and 23B. On the other hand, for example, in the case where a signal magnetic field in the signal magnetic field direction J110 from the recording medium is in the +Y direction as shown in FIG. 24C, the magnetization direction J123 becomes the +Y direction which is the same as the magnetization direction J121. Therefore, the resistance value of the read current decreases. By making, for example, the state of FIG. 24B associated with "0" and making the state of FIG. 24C associated with "1" by using the resistance change, the signal magnetic field can be detected as binary information. As obvious from FIGS. 24A to 24C, the center of the amplitude of the magnetization direction J123 is the state of FIG. 24A (H=0). FIG. 25 shows the relation between the external magnetic field (signal magnetic field) H and electric resistance R in the GMR element 120. In FIG. 25, the external magnetic field in the −Y direction in FIGS. 24A to 24C is set as H>0 and that in the +Y direction is set as H<0. As shown in FIG. 25, as the intensity of the signal magnetic field in the −Y direction increases, the electric resistance R increases and is saturated in the end. As the intensity of the signal magnetic filed in the +Y direction increases, the electric resistance R decreases and is saturated in the end. In such a manner, the electric resistance R changes around the state where the external magnetic field H is zero as a center. Therefore, the GMR element in which the magnetization direction of the free layer and that of the pinned layer are orthogonal to each other at the zero magnetic field does not have to have bias applying means in particular, so that it is generally applied to read magnetic information recorded on a hard disk, a flexible disk, a magnetic tape, or the like. Orthogonalization of the magnetization directions is realized by performing, mainly, a regularization heat treatment process which determines the magnetization direction of the pinned layer and an orthogonalization heat treatment process which follows the regularization heat treatment process and determines the magnetization direction of the free layer.

FIGS. 26A to 26C show the outline of a process of forming the stacked body 120 in which the magnetization direction J121 of the pinned layer 121 and the magnetization direction J123 of the free layer 123 are orthogonal to each other. Concretely, first, while applying a magnetic field H101 in the +X direction for example, the free layer 123 is formed by sputtering or the like and the direction AE123 of the easy axis of magnetization is pinned (refer to FIG. 26A) and, after that, the intermediate layer 122 and the pinned layer 121 are sequentially formed. As shown in FIG. 26B, while applying a magnetic field H102 in the direction (for example, +Y direction) orthogonal to the magnetic field H101, annealing process is performed at a predetermined temperature (regularization heat treatment process). By the process, the magnetization directions J121 and J123 are aligned in the direction of the magnetic field H102. Further, as shown in FIG. 26C, while applying a magnetic field H103 of relatively low intensity in the direction (+X direction) orthogonal to the magnetic field H102, annealing process is performed at a rather low temperature (orthogonalization heat treatment process). By the processes, while the magnetization direction J121 is pinned, only the magnetization direction J123 is directed again to the +X direction. As a result, the stacked body 120 in which the magnetization directions J121 and J123 are orthogonal to each other is completed.

The GMR element having the spin valve structure subjected to the orthogonalization heat process is effective to obtain a high dynamic range as well as high output and is suitable for reproducing a magnetization inverted signal which is digitally recorded. Before such a GMR element is used, an AMR element using anisotropic magneto-resistive (AMR) effect was generally used as means for reproducing a digital recording signal. Hitherto, the AMR element is used as means for reproducing not only a digital signal but also an analog signal (refer to, for example, Translated National Publication of Paten Application No. Hei 9-508214).

Application of the GMR element as means for reproducing an analog signal as well as the foreign AMR element has been being examined. However, when the free layer 123 in the GMR element subjected to the orthogonalization heat treatment is observed from a microscopic viewpoint, as shown in FIG. 27, it is found that spin directions 123S in magnetic domains 123D partitioned by magnetic walls 123W are various and are not aligned in a predetermined direction. Such variations in the spin direction 123S appear as a hysteresis characteristic in the relation between the external magnetic field H and the electric resistance R. FIG. 25 corresponds to an ideal state in which the spin directions in the magnetic domains in the free layer are perfectly aligned in one direction. In reality, however, the spin direction 123S varies, so that a hysteresis curve HC1 is drawn as shown in FIG. 28 and an offset value occurs at the zero magnetic field. The occurrence of the offset value appears as 1/f noise in a relatively low frequency band as shown in FIG. 29. The 1/f noise occurs at a frequency "f" or lower and becomes more conspicuous as the frequency "f" decreases. FIG. 29 shows a state where the influence of a 1/f noise component N2 on "noise voltage density" increases as compared with a white noise component N1 as the frequency "f" decreases. Increase in the 1/f noise is unpreferable since it is a big factor of deteriorating the reliability of the whole system.

SUMMARY OF THE INVENTION

The present invention has been achieved in consideration of such problems and its first object is to provide a magnetic sensing device capable of stably sensing a signal magnetic field at high sensitivity by suppressing appearance of a hysteresis to thereby reduce 1/f noise, and a method of forming the same. A second object of the invention is to provide a magnetic sensor and an ammeter each including such a magnetic sensing device.

A magnetic sensing device of the invention comprises a stacked body including: a pinned layer having a magnetization direction pinned in a predetermined direction; a free layer whose magnetization direction changes according to an external magnetic field and, when the external magnetic field is zero, becomes parallel to the magnetization direction of the pinned layer; and an intermediate layer sandwiched between the pinned layer and the free layer. "Parallel" in the specification includes not only a state where the angle formed between the magnetization direction of the pinned layer and that of the free layer is strictly 0° but also a state where a gradient caused by an error occurring in manufacture, variations in properties, and the like.

By constructing the magnetic sensing device of the invention so that the magnetization direction of the pinned layer and that of the free layer become parallel to each other when the external magnetic field is zero, variations in the spin directions of magnetic domains in the free layer are reduced more as compared with the case where the magnetization direction in the pinned layer and that of the free layer become orthogonal to each other when the external magnetic field is zero. In particular, in the case where the easy axis of magnetization of the free layer is parallel to the magnetization direction of the pinned layer, the spin directions in the magnetic domains are aligned more easily. Consequently, appearance of a hysteresis in the relation between a change in the external magnetic field and a resistance change is suppressed in the case where read current is passed.

The magnetic sensing device according to the invention may also have bias applying means which applies a bias magnetic field to the free layer in a direction orthogonal to the magnetization direction of the pinned layer. In this case, the bias applying means can be constructed by either a permanent magnet or a bias current line extending in the magnetization direction of the pinned layer.

A magnetic sensor of the invention comprises: a first magnetic sensing module including first and second magnetic sensing devices connected to each other at a first connection point; and a second magnetic sensing module including third and fourth magnetic sensing devices connected to each other at a second connection point. The first and second magnetic sensing modules construct a bridge circuit in which an end on the side opposite to the first connection point in the first magnetic sensing device and an end on the side opposite to the second connection point in the fourth magnetic sensing device are connected to each other at a third connection point, an end on the side opposite to the first connection point in the second magnetic sensing device and an end on the side opposite to the second connection point in the third magnetic sensing device are connected to each other at a fourth connection point and, when a voltage is applied across the third and fourth connection points, an output is detected at the first and second connection points. Further, each of the first to fourth magnetic sensing devices comprises: a stacked body including a pinned layer having a magnetization direction pinned in a predetermined direction, a free layer whose magnetization direction changes according to an external magnetic field and, when the external magnetic field is zero, becomes parallel to the magnetization direction of the pinned layer, and an intermediate layer sandwiched between the pinned layer and the free layer; and bias applying means which applies a bias magnetic field to the stacked body in the direction orthogonal to the magnetization direction of the pinned layer.

In the magnetic sensor of the invention, the bias applying means may be constructed by either a permanent magnet or a bias current line extending in the magnetization direction of the pinned layer.

In the magnetic sensor of the invention, preferably, the magnetization directions of the pinned layers of the first and second magnetic sensing devices are parallel to each other, and the magnetization directions of the pinned layers of the third and fourth magnetic sensing devices are parallel to each other. With the configuration, for example, the magnetization directions of the pinned layers in the first and second magnetic sensing devices form the same angle with respect to the direction of the external magnetic field to be sensed. The magnetization directions of the pinned layers in the third and fourth magnetic sensing devices are similar to the above. In particular, it is desirable that the first and second magnetic sensing devices are disposed on the same straight line extending in a direction corresponding to the magnetization directions of the pinned layers of the first and second magnetic sensing device, and the third and fourth magnetic sensing devices are disposed on the same straight line extending in a direction corresponding to the magnetization directions of the pinned layers of the third and fourth magnetic sensing devices. With the configuration, the magnetic sensor can be made more compact. In this case, the first and second magnetic sensing devices may be formed on a first substrate, and the third and fourth magnetic sensing devices may be formed on a second substrate different from the first substrate. "The magnetization directions of the pinned layers are parallel to each other" denotes not only a state where the angle formed by the magnetization directions of the pinned layers is strictly 0° (perfect parallel) but also a state where the angle differs from strict 0° only by a predetermined angle (for example, angle of 10° or less) due to an error occurring in manufacture and the like. The expression "disposed on the same straight line extending in a direction corresponding to the magnetization directions of the pinned layers" denotes not only the case of disposition on the same straight line perfectly parallel to the magnetization directions of the pinned layers but also the case of disposition on the same straight line at an angle inclined from strict 0° only by a predetermined angle (for example, angle of 10° or less) due to an error occurring in manufacture and the like. In any of the cases, strict 0° (perfect parallel) is the most preferable state. "The same straight line" is an imaginary line indicative of a spatial position relation and is not a real line for physical connection.

In the magnetic sensor of the invention, preferably, the magnetization directions of the pinned layers of the first and third magnetic sensing devices are parallel to each other, and the magnetization directions of the pinned layers of the second and fourth magnetic sensing devices are parallel to each other. With the configuration, for example, the magnetization directions of the pinned layers in the first and third magnetic sensing devices form the same angle with respect to the external magnetic field to be sense. The second and fourth magnetic sensing devices are similar to the above. In particular, it is preferable that the first and third magnetic sensing devices are disposed on the same straight line extending in a direction corresponding to the magnetization directions of the pinned layers, and the second and fourth magnetic sensing devices are disposed on the same straight line extending in a direction corresponding to the magnetization directions of the pinned layers. In such a manner, the magnetic sensor can be made more compact as a whole. In this case, the first and third magnetic sensing devices may be formed on a first substrate and the second and fourth magnetic sensing devices may be formed on a second substrate different from the first substrate.

An ammeter of the invention is an ammeter for measuring current to be sensed, by sensing a magnetic field generated by the current to be sensed, comprising: a first magnetic sensing module including first and second magnetic sensing devices connected to each other at a first connection point;

and a second magnetic sensing module including third and fourth magnetic sensing devices connected to each other at a second connection point. The first and second magnetic sensing modules construct a bridge circuit in which an end on the side opposite to the first connection point in the first magnetic sensing device and an end on the side opposite to the second connection point in the fourth magnetic sensing device are connected to each other at a third connection point, an end on the side opposite to the first connection point in the second magnetic sensing device and an end on the side opposite to the second connection point in the third magnetic sensing device are connected to each other at a fourth connection point and, when a voltage is applied across the third and fourth connection points, an output is detected at the first and second connection points. Each of the first to fourth magnetic sensing devices comprises: a stacked body including a pinned layer having a magnetization direction pinned in a predetermined direction, a free layer whose magnetization direction changes according to an external magnetic field and, when the external magnetic field is zero, becomes parallel to the magnetization direction of the pinned layer, and an intermediate layer sandwiched between the pinned layer and the free layer; and bias applying means which applies a bias magnetic field to the stacked body in the direction orthogonal to the magnetization direction of the pinned layer, and a magnetic field generated by the current to be sensed is sensed by each of the first to fourth magnetic sensing devices. Preferably, the current to be sensed flows in parallel or anti-parallel to the magnetization direction of the pinned layer.

By constructing the magnetic sensor and the ammeter of the invention so that the magnetization direction of the pinned layer and that of the free layer are parallel to each other in the first to fourth sensing devices when the external magnetic field is zero, as compared with the case where the magnetization direction of the pinned layer and that of the free layer are orthogonal to each other when the external magnetic field is zero, variations in the spin directions of the magnetic domains in the free layer are reduced. In particular, when the easy axis of magnetization of the free layer is parallel to the magnetization direction of the pinned layer, the spin directions of the magnetic domains are aligned more easily. Thus, appearance of a hysteresis in the relation between a change in the external magnetic field and a resistance change when read current is passed to each of the first to fourth magnetic sensing devices is suppressed.

A method of forming a magnetic sensing device of the invention comprises: a stacking step of forming a stacked body by sequentially forming a first ferromagnetic layer whose magnetization direction changes according to an external magnetic field, an intermediate layer, and a second ferromagnetic layer having coercive force larger than that of the first ferromagnetic layer; and a regularization step of making regularization so that the magnetization directions of the first and second ferromagnetic layers become parallel to each other. By the regularization step, setting of the magnetization directions of the first and second ferromagnetic layers in an initial state where the external magnetic field is zero is completed. The "initial state" denotes a state where no external magnetic field having a specific direction exists and is a reference state at the time of detecting the external magnetic field.

In a method of forming a magnetic sensing device of the invention, setting of the magnetization directions of the first and second ferromagnetic layers in an initial state where an external magnetic field is zero is completed by the regularization step. Consequently, as compared with the case where the first and second ferromagnetic layers have the magnetization directions orthogonal to each other, variations in the spin directions of the magnetic domains in the first ferromagnetic layer are reduced. Particularly, by forming the first ferromagnetic layer so as to have the easy axis of magnetization and making regularization so that the magnetization directions of the first and second ferromagnetic layers are parallel to the easy axis of magnetization, variations in the spin directions are reduced more. Consequently, in the case of passing read current, appearance of a hysteresis in the relation between a change in the external magnetic field and a resistance change is suppressed.

In a method of forming a magnetic sensing device of the invention, it is preferable to make regularization by performing an annealing process at a temperature in a range from 250° C. to 400° C. while applying a magnetic field in a range from 1.6 kA/m to 160 kA/m. In the step of forming the first ferromagnetic layer, by forming a layer while applying a magnetic field in a predetermined direction, the direction of the easy axis of magnetization can be determined.

Since the magnetic sensing device of the invention is provided with the stacked body including the pinned layer having the magnetization direction pinned to a predetermined direction, the free layer having the magnetization direction which changes according to the external magnetic field and is parallel to the magnetization direction of the pinned layer when the external magnetic field is zero, and the intermediate layer sandwiched between the pinned layer and the free layer. Consequently, appearance of a hysteresis of a resistance change with respect to a change in the external magnetic field when read current is passed can be suppressed, and an offset value at the zero magnetic field can be reduced. Therefore, 1/f noise is suppressed and a signal magnetic field can be stably sensed at high sensitivity. In this case, the value of the magnetic field intensity can be measured accurately and continuously, so that the magnetic sensing device of the invention can be applied not only to a digital sensor but also to an analog sensor. In particular, when the free layer has the easy axis of magnetization parallel to the magnetization direction of the pinned layer, an offset value at the zero magnetic field can be reduced more. As a result, sensitivity and stability can be improved more.

When the magnetic sensing device of the invention is further provided with bias applying means which applies a bias magnetic field in a direction orthogonal to the magnetization direction of the pinned layer to the free layer, by applying a bias magnetic field of proper intensity, a resistance change of read current with respect to an external magnetic field can be made linear. In the case of constructing the bias applying means by a bias current line extending in the magnetization direction of the pinned layer, by determining the direction of passing the bias current, the direction of the bias magnetic field can be also determined.

Each of the magnetic sensor and the ammeter of the invention has: a first magnetic sensing module including first and second magnetic sensing devices connected to each other at a first connection point; and a second magnetic sensing module including third and fourth magnetic sensing devices connected to each other at a second connection point. The first and second magnetic sensing modules construct a bridge circuit in which an end on the side opposite to the first connection point in the first magnetic sensing device and an end on the side opposite to the second connection point in the fourth magnetic sensing device are connected to each other at a third connection point, an end on the side opposite to the first connection point in the second magnetic sensing device and an end on the side opposite to the second connection point in the third magnetic sensing device are connected to each other at a fourth connection point and, when a voltage is applied across the third and fourth connection points, an output is detected at the first and second connection points. Each of the first to fourth magnetic sensing devices comprises: a stacked body including a pinned layer having a magnetization direction pinned in a predetermined direction, a free layer whose magnetization direction changes according to an external magnetic field and, when the external magnetic field is zero, becomes parallel to the magnetization direction of the pinned layer, and an intermediate layer sandwiched between the pinned layer and the free layer; and bias applying means which applies a bias magnetic field to the stacked body in the direction orthogonal to the magnetization direction of the pinned layer. Thus, appearance of a hysteresis of a resistance change with respect to a change in the external magnetic field in the case where read current is passed is suppressed, and an offset value at the zero magnetic field can be reduced. Therefore, 1/f noise is suppressed and a signal magnetic field can be stably sensed with high sensitivity. By constructing the bridge circuit, reliability improves more than the case where a signal magnetic field is sensed only by one magnetic sensing device, so that even a weak magnetic field can be stably sensed with high sensitivity. In this case, the value of the magnetic field intensity itself can be measured accurately and continuously, so that the magnetic sensor of the invention is optimum not only as a digital sensor but also as an analog sensor. Particularly, in the ammeter of the invention, each of the first to fourth magnetic sensing devices senses a magnetic field to be sensed, which is generated by the current to be sensed. Thus, the ammeter of the invention is suitable for higher-precision current measurement.

A method of forming a magnetic sensing device of the invention comprises: a stacking step of forming a stacked body by sequentially forming a first ferromagnetic layer whose magnetization direction changes according to an external magnetic field, an intermediate layer, and a second ferromagnetic layer having coercive force larger than that of the first ferromagnetic layer; and a regularization step of making regularization so that the magnetization directions of the first and second ferromagnetic layers become parallel to each other. By the regularization step, setting of the magnetization directions of the first and second ferromagnetic layers in an initial state where the external magnetic field is zero is completed. Consequently, the configuration in which variations in the spin directions of the magnetic domains in the first ferromagnetic layer are reduced more than the case where the magnetization directions of the first and second ferromagnetic layers are orthogonal to each other can be obtained. Particularly, by forming the first ferromagnetic layer so as to have the easy axis of magnetization and making regularization so that the magnetization directions of the first and second ferromagnetic layers become parallel to the easy axis of magnetization, a configuration in which variations in the spin directions are reduced more can be obtained. Therefore, 1/f noise is suppressed and a signal magnetic field can be stably sensed with high precision. In this case, the intensity of the magnetic field itself can be accurately and continuously measured, so that the magnetic sensing device formed in such a manner can be sufficiently applied not only to a digital sensor but also to an analog sensor. Particularly, when the free layer has the easy axis of magnetization parallel to the magnetization direction of the pinned layer, an offset value at the zero magnetic field can be reduced more. As a result, sensitivity and stability can be improved more.

Other and further objects, features and advantages of the invention will appear more fully from the following description.

BRIEF DESCRIPTION OF THE DRAWINGS

FIGS. 8A and 8B are conceptual diagrams showing a process of forming the magnetic sensing device illustrated in FIGS. 1A to 1C.

FIG. 9 is a schematic diagram showing the configuration of a magnetic sensor according to a second embodiment of the invention.

DETAILED DESCRIPTION OF THE PRFERRED EMBODIMENTS

Embodiments of the invention will now be described in detail hereinbelow with reference to the drawings.

First Embodiment

First, the configuration of a magnetic sensing device as a first embodiment of the invention will be described with reference to FIGS. 1A to 1C to FIG. 5.

Figure 1:
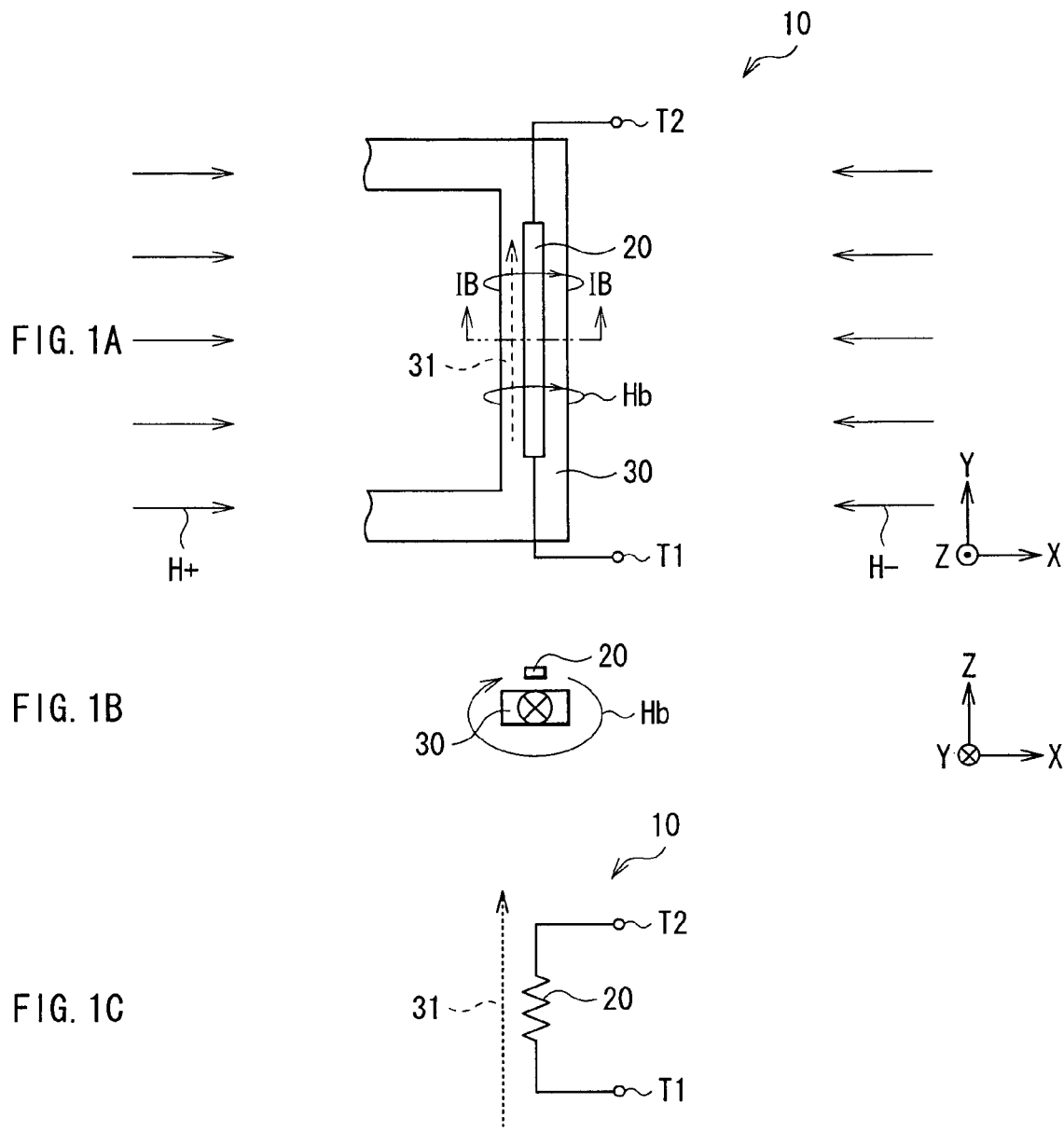
FIGS. 1A to 1C are schematic diagrams showing the configuration of a magnetic sensing device according to a first embodiment of the invention.

FIGS. 1A to 1C show a schematic configuration of a magnetic sensing device 10 of the first embodiment. FIG. 1A is a plan view showing the configuration of the magnetic sensing device 10 and FIG. 1B shows a sectional configuration of the magnetic sensing device 10, taken along the line IB-IB of FIG. 1A. FIG. 1C shows an equivalent circuit corresponding to FIG. 1A. The magnetic sensing device 10 senses the presence/absence of a magnetic field in the environment of the magnetic sensing device 10 (external magnetic field) and the intensity of the magnetic field.

As shown in FIG. 1A, in the magnetic sensing device 10, a stacked body 20 and a bias current line 30 as bias applying means provided adjacent to the stacked body 20 are formed on a not-shown board. The stacked body 20 has a pinned layer whose magnetization direction is pinned in a predetermined direction (+Y direction in FIG. 1A) as will be described in detail later. The bias current line 30 is disposed so as to extend in the magnetization direction of the pinned layer near the stacked body 20. Bias current 31 can be passed to the bias current line 30. As shown in FIGS. 1A and 1B, the bias current 31 can be passed in the direction of the arrow (+Y direction around the stacked body 20) or the opposite direction (−Y direction around the stacked body 20). The bias current line 30 is electrically insulated from the stacked body 20. Separately from the bias current line 30, a conductor is connected to the stacked body 20 and read current can be passed between terminals T1 and T2. In this case, the stacked body 20 can be regarded as a resistor, so that the magnetic sensing device 10 is an equivalent circuit as shown in FIG. 1C.

Figure 2:
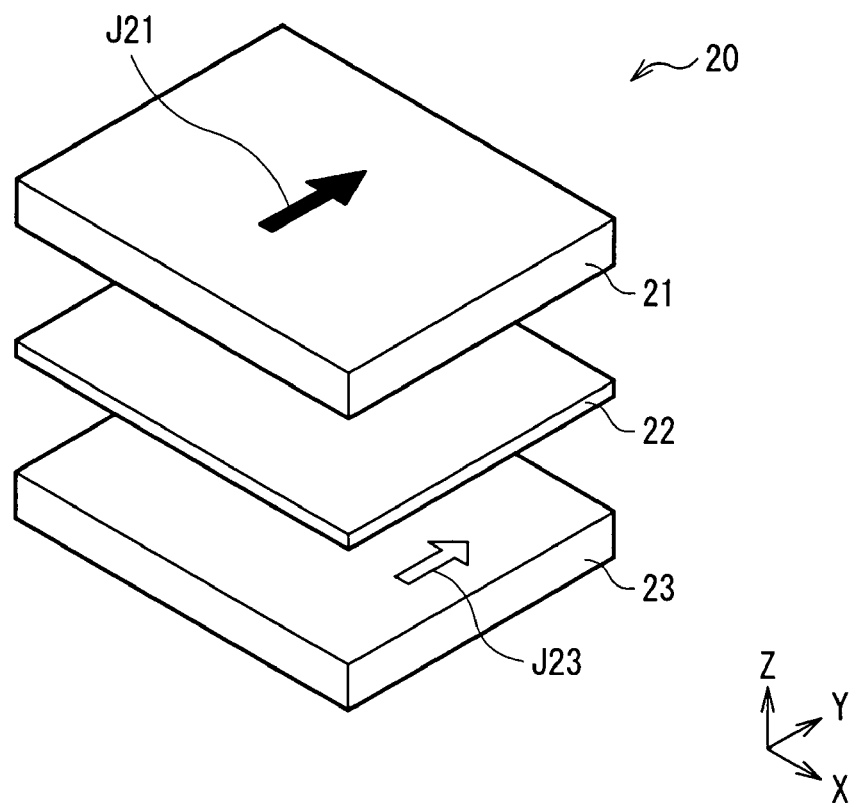
FIG. 2 is an exploded perspective view showing a stacked body as a component of the magnetic sensing device illustrated in FIGS. 1A to 1C.

The stacked body 20 is obtained by stacking a plurality of functional films including a magnetic layer and, as shown in FIG. 2, includes a pinned layer 21 having a magnetization direction J21 pinned to a predetermined direction (for example, Y direction in FIG. 2), a free layer 23 having a magnetization direction J23 which changes according to the external magnetic field H and becomes parallel to the magnetization direction J21 of the pinned layer 21 when the external magnetic field H is zero (H=0), and an intermediate layer 22 sandwiched between the pinned layer 21 and the free layer 23 and having no specific magnetization direction. FIG. 2 shows an initial state where the external magnetic field H is zero. Each of the top face (the face on the side opposite to the intermediate layer 22) of the pinned layer 21 and the under face (the face on the side opposite to the intermediate layer 22) of the free layer 23 is protected with a not-shown protection layer. The intermediate layer 22 is made of, generally, a non-magnetic material having high conductivity such as copper (Cu) or gold (Au). In this case, the stacked body 20 is a GMR element having the spin valve structure. When the external magnetic field H is applied, the relative angle between the magnetization direction J23 of the free layer 23 and the magnetization direction J21 of the pinned layer 21 changes. The relative angle varies according to the magnitude and direction of the external magnetic field H. Alternately, by making the intermediate layer 22 of an insulating material such as aluminum oxide ($Al_2O_3$), a tunnel magneto-resistive effect element using the tunnel effect can be formed. Although FIG. 2 shows an example of the configuration in which the free layer 23, intermediate layer 22, and pinned layer 21 are stacked in order from the bottom, the invention is not limited to the configuration and the layers may be stacked in reverse order.

Figure 3:
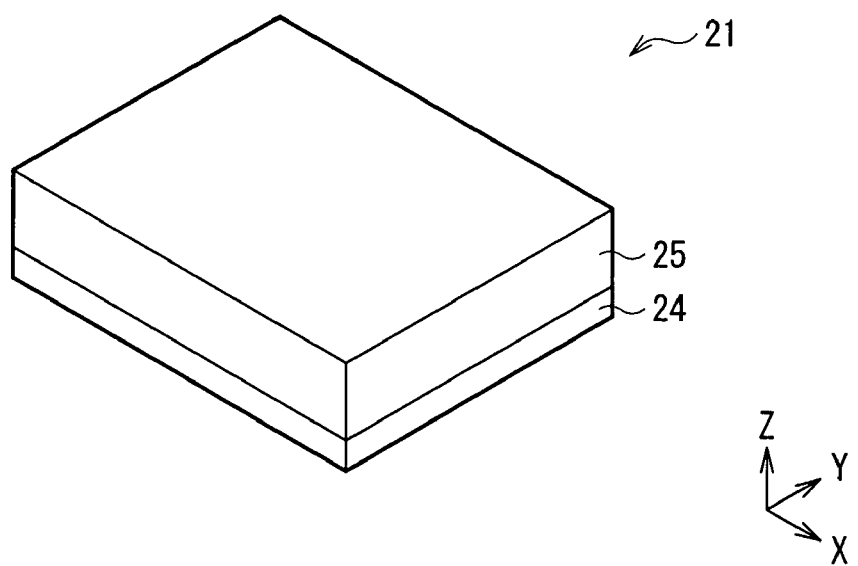
FIG. 3 is a perspective view showing a detailed configuration of a part of the stacked body illustrated in FIG. 2.

FIG. 3 shows a detailed configuration of the pinned layer 21. As shown in FIG. 3, the pinned layer 21 has a configuration in which a magnetization pinned film 24 and an antiferromagnetic film 25 are stacked in order from the side of the intermediate layer 22. The magnetization pinned film 24 is made of a ferromagnetic material such as cobalt (Co), cobalt iron alloy (CoFe) or the like. The magnetization direction of the magnetization pinned layer 24 is the magnetization direction J21 of the pinned layer 21 as a whole. The antiferromagnetic film 25 is made of an antiferromagnetic material such as platinum manganese alloy (PtMn) or iridium manganese alloy (IrMn). The antiferromagnetic film 25 is in a state where the spin magnetic moment in a predetermined direction (for example, the +Y direction) and the spin magnetic moment in the opposite direction (for example, the −Y direction) completely cancel out each other, and functions so as to pin the magnetization direction J21 of the magnetization pinned film 24.

Figure 4:
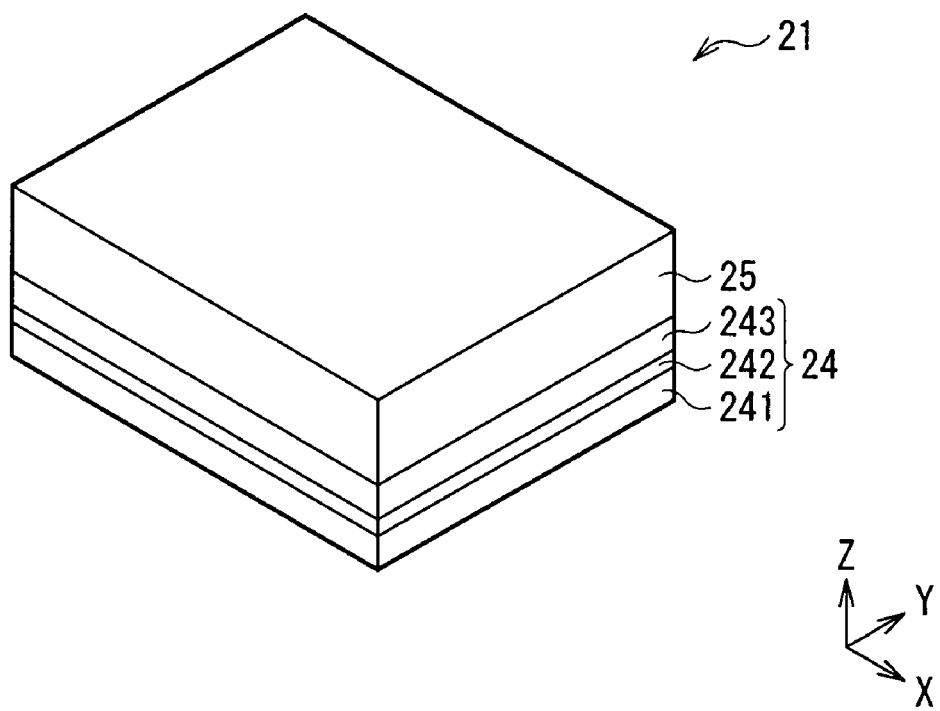
FIG. 4 is a perspective view showing a more detailed configuration of a part of the stacked body illustrated in FIG. 2.

The magnetization pinned film 24 may have a single layer structure or a configuration in which a first ferromagnetic film 241, an exchange coupling film 242, and a second ferromagnetic film 243 are stacked in order from the side of the intermediate layer 22 as shown in FIG. 4. The stacked body 20 including the pinned layer 21 having the configuration of FIG. 4 is called a synthetic spin valve structure. The first and second ferromagnetic films 241 and 243 are made of a ferromagnetic material such as cobalt, CoFe or the like and the exchange coupling film 242 is made of a non-magnetic material such as ruthenium (Ru). In this case, the first and second ferromagnetic films 241 and 243 are exchange-coupled via the exchange coupling film 242 so that their magnetization directions become opposite to each other, so that the magnetization direction of the magnetization pinned film 24 as a whole is stabilized. Further, a leak magnetic field which leaks from the magnetization pinned film 24 to the free layer 23 can be weakened.

Figure 5:
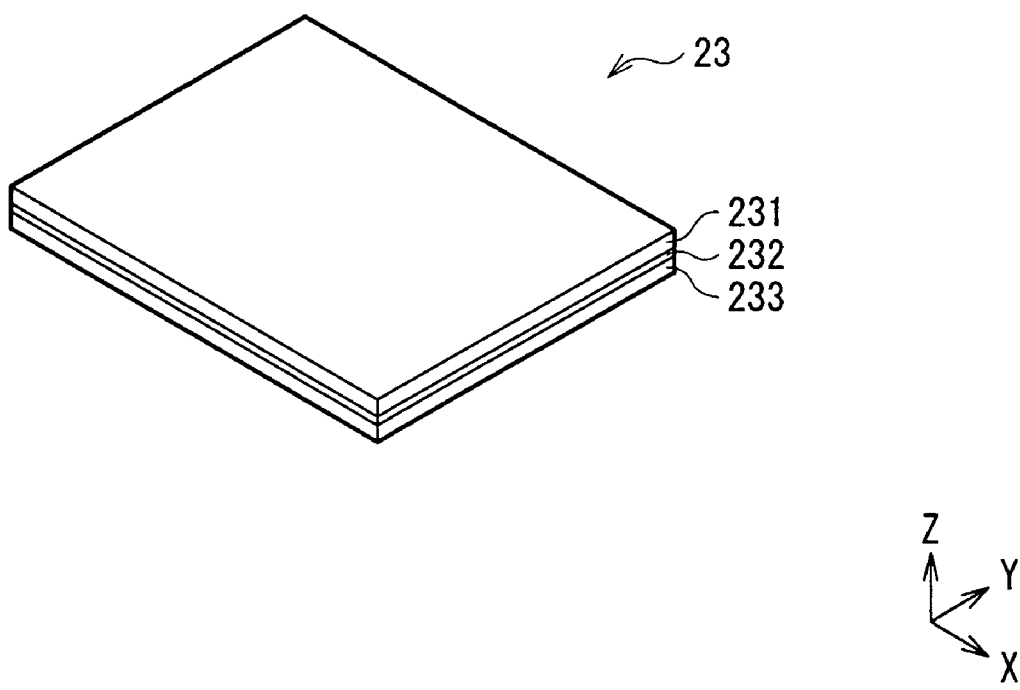
FIG. 5 is a perspective view showing a detailed configuration of another part of the stacked body illustrated in FIG. 2.

The free layer 23 may have a single-layer structure or a configuration in which two ferromagnetic thin films 231 and 233 are exchange coupled to each other via an intermediate film 232 as shown in FIG. 5. In this case, the coercive force in the axis of hard magnetization of the free layer 23 can be further decreased.

The bias current line 30 is made of a metal material having high conductivity such as copper (Cu), gold (Au), or the like and functions so as to apply a bias magnetic field Hb to the stacked body 20.

The action of the magnetic sensing device 10 having the above configuration will now be described.

Figure 6:
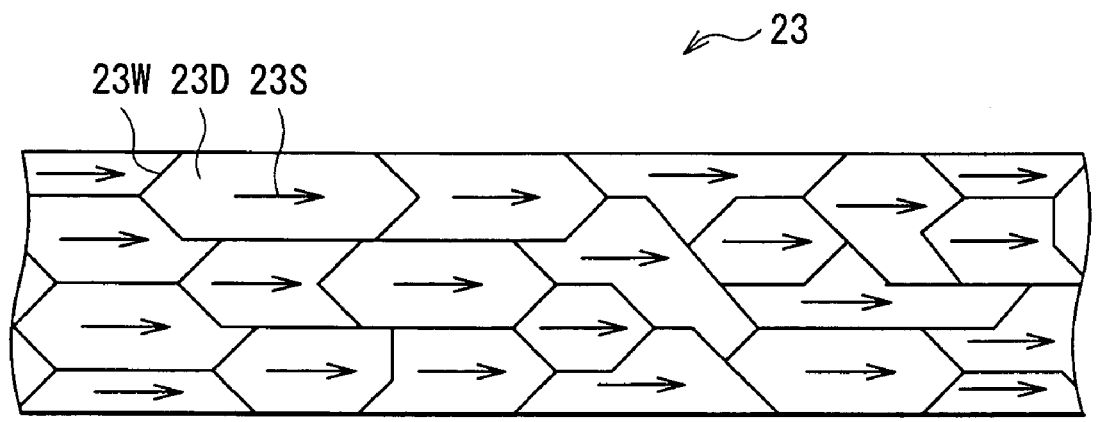
FIG. 6 is a conceptual diagram schematically showing a spin direction distribution in a free layer of the stacked body illustrated in FIG. 2.

Different from the magnetization pinned film 24, the magnetization direction J23 of the free layer 23 rotates according to the magnitude and direction of the external magnetic field H. The easy axis of magnetization of the free layer 23 is parallel to the magnetization direction J21 of the pinned layer 21. Therefore, in the stacked body 20, when the external magnetic field H is zero (that is, the initial state shown in FIG. 2), all of the easy axis of magnetization of the free layer 23 and the magnetization directions J23 and J21 are parallel to each other. Consequently, when the external magnetic field H is zero, the spin directions in the free layer 23 are easily aligned in a predetermined direction. FIG. 6 is a conceptual diagram schematically showing spin directions in magnetic domains in the free layer 23. As shown in FIG. 6, the free layer 23 has a plurality of magnetic domains 23D partitioned by magnetic walls 23W and spins 23S are almost aligned in the same direction (magnetization direction J23).

Figure 7:
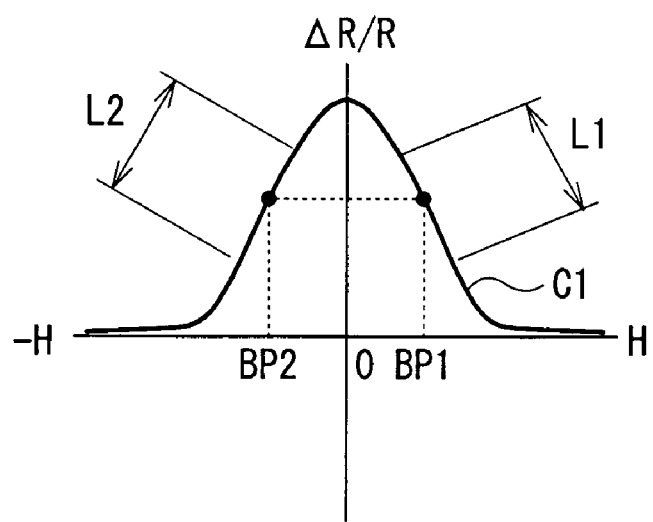
FIG. 7 is a characteristic diagram showing magnetic field dependency of a resistance change in the magnetic sensing device illustrated in FIG. 1.

The stacked body 20 including the free layer 23 in which the spin directions are aligned hardly shows a hysteresis. FIG. 7 shows the relation between the external magnetic field H and resistance change rate ΔR/R. The relation is expressed by an almost one curve C1 which is bilaterally symmetrical and whose peak is at the external magnetic field H=0. That is, when the external magnetic field H is zero, an offset value is hardly generated. Consequently, 1/f noise which is sensed when sensing (of external magnetic field) is executed by using the magnetic sensing device 10 is reduced.

In the case of performing sensing by using the magnetic sensing device 10 of the embodiment, as shown in FIGS. 1A and 1B, the bias magnetic field Hb is applied to the stacked body 20 by using the bias current line 30. Concretely, by passing the bias current 31 in, for example, the +Y direction to the bias current line 30, the bias magnetic field Hb in the +X direction to the stacked body 20. Both of the magnetization directions J21 and J23 are disposed so as to be the +Y direction and are orthogonal to the bias magnetic field Hb. The reason why the bias magnetic field Hb is applied is because the curve C1 is non-linear around the external magnetic field H=0 as shown in FIG. 7. To detect a change in the external magnetic field H with high precision, it is desirable to use the characteristics of two linear regions L1 and L2 corresponding to inclined face portions on both side in the curve C1. Therefore, it is necessary to apply the bias magnetic field Hb of the magnitude corresponding to a bias point BP1 or BP2 has to be applied in an initial state. The bias points BP1 and BP2 are positioned in the center of the linear regions L1 and L2, respectively, and in positions indicative of the resistance change rates ΔR/R which are equal to each other.

For example, if the magnetic field H in the +X direction is positive in FIG. 1A, it is preferable to pass the bias current 31 in the +Y direction to generate the bias magnetic field Hb (BP1) corresponding to the bias point BP1. When the external magnetic field H+ in the positive direction (+X direction) is applied in this state, as obvious from the curve C1 of FIG. 7, the resistance change rate ΔR/R of the stacked body 20 becomes lower (than that in the initial state). On the contrary, when the external magnetic field H− in the negative direction (−X direction) is applied in the initial state where the bias magnetic field Hb (BP1) is applied, the resistance change rate ΔR/R of the stacked body 20 becomes higher (than that in the initial state). In the case where the bias magnetic field Hb (BP2) corresponding to the bias point BP2 is generated by passing the bias current 31 in the −Y direction, when the external magnetic field H+ in the positive direction (+X direction) is applied, the resistance change rate ΔR/R becomes higher (than that in the initial state). When the external magnetic field H− in the negative direction (−X direction) is applied, the resistance change rate ΔR/R becomes lower (than that in the initial state). As described above, in any of the cases, the direction of the external magnetic field H can be known from the direction of change in the resistance change rate ΔR/R and, moreover, the magnitude of the external magnetic field H can be known from the magnitude of the change in the resistance change rate ΔR/R. Without the bias applying means, the sensing can be performed. However, when the linear regions L1 and L2 are used with the bias applying means, sensing can be performed with higher precision.

A method of forming the magnetic sensing device 10 will now be described in detail hereinbelow with reference to FIG. 2 and FIGS. 8A and 8B. FIGS. 8A and 8B are conceptual diagrams showing a simplified process of forming the magnetic sensing device 10.

In the method of forming the magnetic sensing device 10 of the embodiment, first, a first ferromagnetic layer (as the free layer 23) is formed on a not-shown substrate by sputtering or the like by using a soft magnetic material such as NiFe. At this time, a direction AE23 of the easy axis of magnetization is determined by forming the film while applying a magnetic field H1 in a predetermined position (for example, the +Y direction) (refer to FIG. 8A). The intermediate layer 22 is formed by using a non-magnetic material such as copper and a second ferromagnetic film (which will become the pinned layer 21) is formed by using a material having a coercive force larger than that of the first ferromagnetic film (stacking process). After that, regularization is made so that the magnetization direction J23 of the first ferromagnetic layer and the magnetization direction J21 of the second ferromagnetic layer correspond to the direction AE23 of the easy axis of magnetization (regularization process). Concretely, while applying the magnetic field H2 having intensity in a range from 1.6 kA/m to 160 kA/m in the same direction as the direction AE23 of the easy axis of magnetization, annealing process is performed at a temperature in a range from 250° C. to 400° C. By the process, the pinned layer 21 having the magnetization direction J21 pinned in a predetermined direction (+Y direction) is formed, and the free layer 23 having the direction AE23 of the easy axis of magnetization which is the same as the magnetization direction J21 and the magnetization direction J23 is formed. By the regularization process, setting of the magnetization directions J21 and J23 of the pinned layer 21 and the free layer 23 in the initial state where the external magnetic field H is zero is completed. In such a manner, formation of the stacked body 20 in which the free layer 23, intermediate layer 22, and pinned layer 21 are sequentially formed on the substrate is completed.

As described above, in the magnetic sensing device 10 and the method of forming the same of the embodiment, the stacked body 20 is provided, which includes the pinned layer 21 having the magnetization direction J21 pinned to a predetermined direction (Y direction), the free layer 23 having the magnetization direction J23 which changes according to the external magnetic field H and is parallel to the magnetization direction J21 when the external magnetic field H is zero, and the intermediate layer 22 sandwiched between the pinned layer 21 and the free layer 23. Consequently, as compared with the case where the pinned layer 21 and the free layer 23 have magnetization directions which are orthogonal to each other when the external magnetic field H is zero, variations in the spin directions of the magnetic domains in the free layer 23 can be reduced. In the case of passing read current, appearance of a hysteresis in the relation between the change in the external magnetic field H and the resistance change R can be suppressed. As a result, 1/f noise is suppressed and a signal magnetic field can be stably sensed at high sensitivity. In particular, the value of the magnetic field intensity can be measured accurately and continuously, so that the magnetic sensor is suitable as an analog sensor such as an ammeter.

Second Embodiment

Referring now to FIG. 9, as a second embodiment of the invention, the configuration of a magnetic sensor (ammeter) using the magnetic sensing device of the invention described in the first embodiment will be described.

FIG. 9 shows a schematic configuration of a magnetic sensor 1 of the invention.

The magnetic sensor 1 shown in FIG. 9 is an ammeter for detecting a magnetic field to be sensed which is generated by current to be sensed flowing in parallel or anti-parallel to the magnetization direction of a pinned layer. The magnetic sensor 1 has a first magnetic sensing module (hereinbelow, simply called a first module) 11 constructed by first and second magnetic sensing devices 10A and 10B connected to each other at a first connection point P1 and a second magnetic sensing module (hereinbelow, simply called a second module) 12 constructed by third and fourth magnetic sensing devices 10C and 10D connected to each other at a second connection point P2. The first and second modules 11 and 12 construct a bridge circuit. More specifically, the first and second modules 11 and 12 construct a bridge circuit in such a manner that the end on the side opposite to the connection point P1 in the first magnetic sensing device 10A and the end on the side opposite to the second connection point P2 in the fourth magnetic sensing device 10D are connected at a third connection point P3, the end on the side opposite to the first connection point P1 in the second magnetic sensing device 10B and the end on the side opposite to the second connection point P2 in the third magnetic sensing device 10C are connected at a fourth connection point P4 and, when predetermined voltage is applied across the third and fourth connection points P3 and P4, an output is detected at the first and second connection points P1 and P2. In the magnetic sensor 1, the first and second modules 11 and 12 are provided on a single substrate 40.

In FIG. 9, the stacked body 20 (20A to 20D) in the magnetic sensing device 10 (10A to 10D) is shown as a resistor, and the magnetization direction J21 (J21A to J21D) of the pinned layer 21 (21A to 21D) is shown by an arrow of solid line. The direction of the bias current line 30 (30A to 30D) and the bias current 31 (31A to 31D) is expressed by an arrow of broken line. The bias current lines 30A to 30D may be provided independently from each other or may be connected to a singe line so as to draw the number eight.

In any event, it is sufficient to construct so that the bias currents 31A to 31D flow in the directions indicated by the arrows of broken line to the stacked bodies 20A to 20D connected as shown in FIG. 9. All of the magnetization directions J21A to J21D in the stacked bodies 20A to 20D are aligned in the same direction (+Y direction). Further, the first and second magnetic sensing devices 10A and 10B are disposed in the same straight line extending in the direction corresponding to the magnetization directions J21A and J21B, and the third and fourth magnetic sensing devices 10C and 10D are disposed in the same straight line extending in the direction corresponding to the magnetization directions J21C and J21D. Since the direction of the bias currents 31A and 31C is the +Y direction, the bias magnetic field Hb (not shown here) is applied in the +X direction to the stacked bodies 20A and 20C (that is, Hb>0). In this case, the bias currents 31A and 31C are adjusted so that the bias magnetic field Hb having magnitude corresponding to the bias point BP1 in the characteristic diagram of FIG. 7 is obtained. On the other hand, the direction of the bias currents 31B and 31D is the −Y direction, so that the bias magnetic field Hb (not shown here) is applied in the −X direction to the stacked bodies 20B and 20D (that is, Hb<0). In this case, the bias currents 31B and 31D are adjusted so that the bias magnetic field Hb having magnitude corresponding to the bias point BP2 in the characteristic diagram of FIG. 7 is obtained. By using the magnetic sensor 1 having such a configuration, the external magnetic field can be detected.

Figure 10:
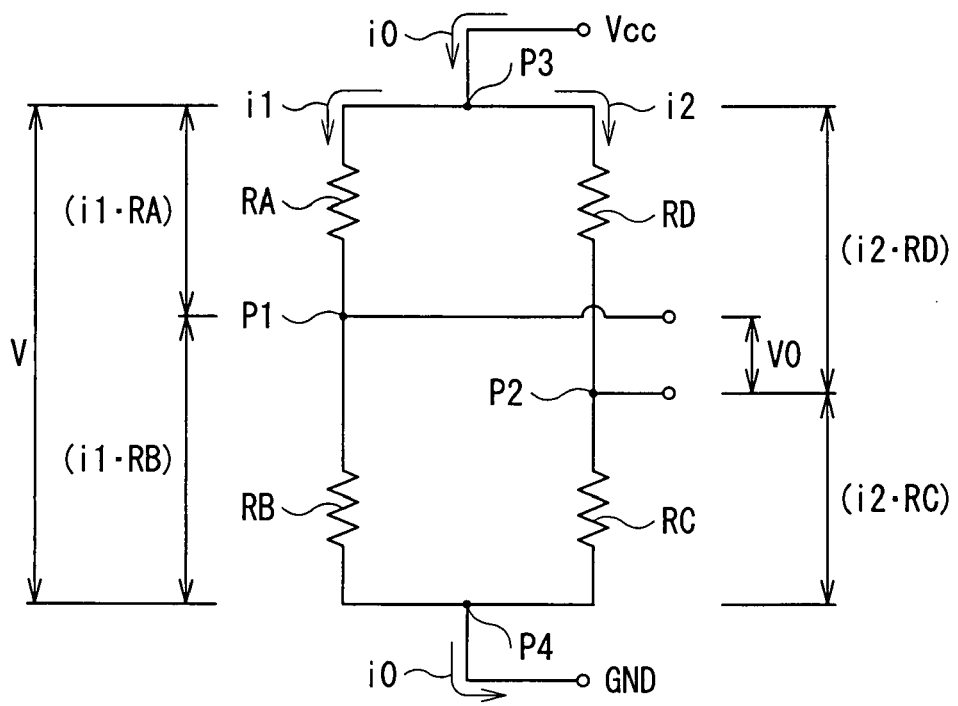
FIG. 10 is a circuit diagram for explaining a resistance change amount when an external magnetic field is applied to the magnetic sensor illustrated in FIG. 9.

For example, a case of measuring the magnitude of the external magnetic field H+ as a magnetic field to be sensed, which is generated by current (current to be detected) flowing in the +Y direction and applied in the +X direction throughout the magnetic sensor 1 will be examined. The case will be described hereinbelow with reference to FIG. 10 in addition to FIG. 9. FIG. 10 is a circuit diagram for explaining a resistance change amount when an external magnetic field is applied.

In FIG. 10, the resistance values of the stacked bodies 20A to 20D when read current $i_0$ is passed in a state where the external magnetic field H+ is not applied are indicated by reference characters RA to RD, respectively. The read current $i_0$ is split at the third connection point P3. After that, read current $i_1$ which has passed the stacked bodies 20A and 20B and read current $i_2$ which has passed the stacked bodies 20D and 20C join at the fourth connection point P4. In this case, the potential difference V between the third and fourth connection points P3 and P4 can be expressed as follows.

$$V = i_1 RA + i_1 RB \qquad (1)$$
$$= i_2 RD + i_2 RC$$
$$= i_1 (RA + RB)$$
$$= i_2 (RD + RC)$$

The potential V1 at the first connection point P1 and the potential V2 at the second connection point P2 can be expressed as follows.

$$V1 = V - i_1 RA$$
$$V2 = V - i_2 RD$$

Therefore, the potential difference V0 between the first and second connection points P1 and P2 is expressed as follows.

$$V0 = V1 - V2 \quad (2)$$
$$= (V - i_1 RA) - (V - i_1 RD)$$
$$= i_2 RD - i_1 RA$$

From Equation (1), the following is derived.

$$V0 = RD/(RD+RC) \cdot V - RA/(RA+RB) \cdot V \quad (3)$$
$$= \{RD/(RD+RC) - RA/(RA+RB)\} \cdot V$$

In the bridge circuit, by measuring the voltage V0 between the first and second connection points P1 and P2 expressed by Equation (3) when the external magnetic field H+ is applied, a resistance change amount is obtained. If the resistance values RA to RD increase only by change amounts ΔRA to ΔRD, respectively, when the external magnetic field H+ is applied, that is, if the resistance values RA to RD change as follows:

$$RA \rightarrow RA + \Delta RA$$
$$RB \rightarrow RB + \Delta RB$$
$$RC \rightarrow RC + \Delta RC$$
$$RD \rightarrow RD + \Delta RD$$

after application of the external magnetic field H+, the following is obtained from Equation (3).

$$V0 = \{(RD+\Delta RD)/(RD+\Delta RD+RC+\Delta RC) - (RA+\Delta RA)/(RA+\Delta RA+RB+\Delta RB)\} \cdot V \quad (4)$$

In the magnetic sensor 1, bias magnetic fields in opposite directions are applied to the stacked bodies 20A and 20C and the stacked bodies 20B and 20D, so that the change amounts ARD and ARC cancel out each other, and the change amounts ΔRA and ΔRB cancel out each other. Consequently, in the case of comparing before and after application of the external magnetic field H+, the denominators in the terms of Equation (4) hardly increase. On the other hand, the numerator of each term increases or decreases since the change amounts ΔRD and ΔRA always have signs opposite to each other. Specifically, as obviously understood from FIGS. 7 and 9, in the stacked bodies 20A and 20C to which the bias magnetic field Hb corresponding to the bias point BP1 is preliminarily applied, when the external magnetic field H+ is applied, the resistance values decrease only by the change amounts ΔRA and ΔRC, respectively (since ΔRA, ΔRC<0, substantially, the resistance values increase). On the other hand, in the stacked bodies 20B and 20D to which the bias magnetic field Hb corresponding to the bias point BP2 is preliminarily applied, when the external magnetic field H+ is applied, the resistance values decrease only by the change amounts ΔRB and ΔRD, respectively (ΔRB, ΔRD>0).

When it is assumed that the stacked bodies 20A to 20D have the same characteristic, that is, R=RA=RB=RC=RD and ΔR=ΔRA=−ΔRB=ΔRC=−ΔRD, Equation (4) is expressed as follows.

$$V0 = \{(R+\Delta R)/(2R) - (R-\Delta R)/(2R)\} \cdot V = (\Delta R/R) \cdot V$$

By using the magnetic sensor 1 having the magnetic sensing device 10 grasping the characteristic values such as the resistance change rate ΔR/R in advance, the magnitude of the external magnetic field H+ and the magnitude of the current I generating the external magnetic field H+ can be measured. In particular, when the bridge circuit is constructed by using the four magnetic sensing devices 10A to 10D and sensing is performed, as compared with the case of performing sensing by using a single magnetic sensing device having equivalent output, a larger resistance change amount in each of the magnetic sensing devices can be sensed and precision of the measurement value can be improved. In the second embodiment, the magnetization directions J21A to J21D of the pinned layers 21A to 21D in the first to fourth magnetic sensing devices 10A to 10D are parallel to each other, so that the magnetization directions J21A to J21D form the same angle with respect to the direction of the external magnetic field H to be sensed. Consequently, it is relatively easy to suppress variations in the sensing sensitivity in the first to fourth magnetic sensing devices 10A to 10D. In particular, the first and second magnetic sensing devices 10A and 10B are disposed on the same straight line extending in the direction corresponding to the magnetization directions J21A and J21B, and the third and fourth magnetic sensing devices 10C and 10D are disposed on the same straight line extending in the direction corresponding to the magnetization directions J21C and J21D. Thus, the magnetic sensor 1 can be made more compact as a whole.

Some modifications of the magnetic sensor 10 of the second embodiment will now be described. In the following modifications, description of the same points as those of the foregoing embodiment will not be repeated properly and different point will be mainly described.

First Modification

Figure 11:
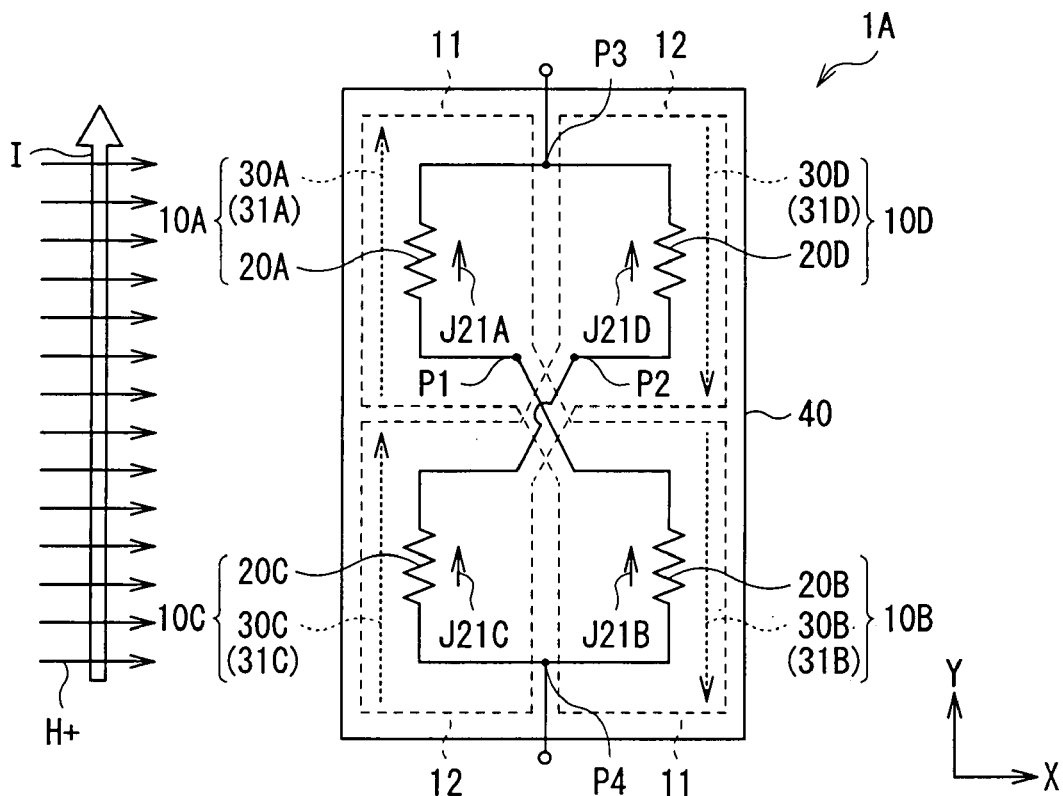
FIG. 11 is a schematic diagram showing a first modification of the magnetic sensor illustrated in FIG. 9.

FIG. 11 shows the configuration of a magnetic sensor 1A as a first modification. In the magnetic sensor 1A, like in the magnetic sensor 1, a bridge circuit is constructed by the first and second modules 11 and 12 formed on the same substrate (substrate 40). The magnetic sensor 1A, however, is different from the magnetic sensor 1 with respect to the point that the first and second magnetic sensing devices 10A and 10B are disposed diagonally, and the third and fourth magnetic sensing devices 10C and 10D are disposed diagonally. Specifically, the first and third magnetic sensing devices 10A and 10C are disposed on the same straight line extending in the direction corresponding to the magnetization directions J21A and J21C, and the second and fourth magnetic sensing devices 10B and 10D are disposed in the same straight line extending in the direction corresponding to the magnetization directions J21B and J21D. The relation between each stacked body 20 and the direction of each bias current 31 is similar to that of the magnetic sensor 1. The magnetic sensors 10 and 10A have substantially the same circuit configuration. In the magnetic sensor 1A, instead of forming the bridge circuit in the shape of eight, the bias current line 30 can be formed in a loop shape.

Second Modification

Figure 12:
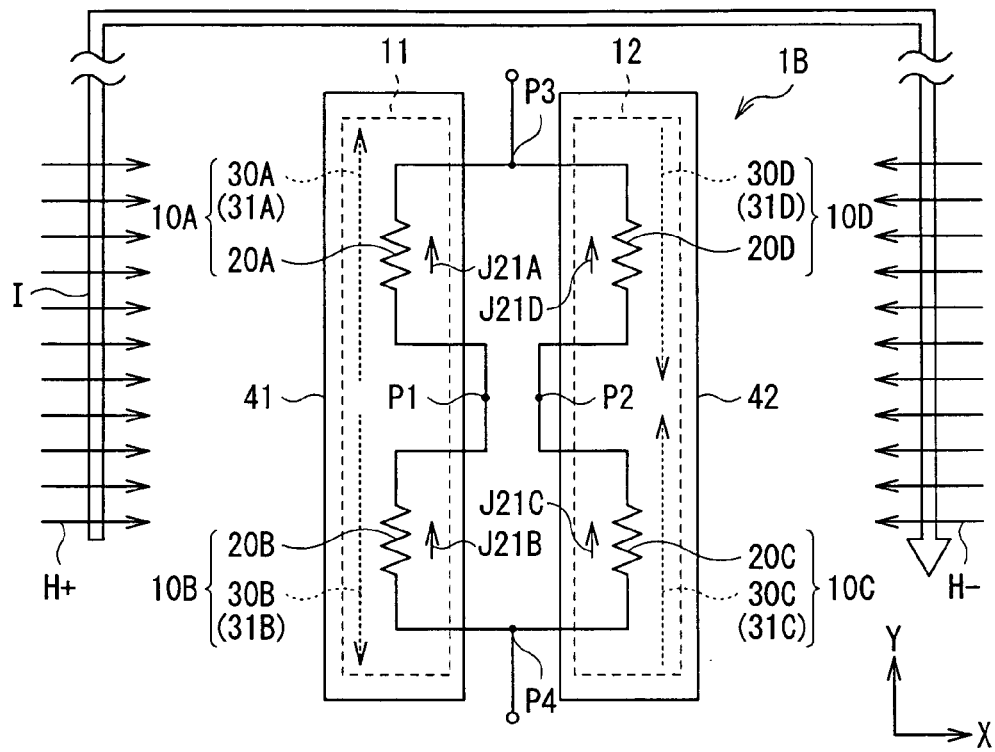
FIG. 12 is a schematic diagram showing a second modification of the magnetic sensor illustrated in FIG. 9.

FIG. 12 shows the configuration of a magnetic sensor 1B as a second modification. In the magnetic sensors 1 and 1A shown in FIGS. 9 and 11, the first and second modules 11 and 12 are formed on the same substrate (substrate 40). In the second modification, a bridge circuit is constructed by forming the first module 11 on a first substrate 41 and forming the second module 12 on a second substrate 42 which is different from the first substrate 41. Concretely, the first and second magnetic sensing devices 10A and 10B are formed on the first substrate 41 so that the magnetization directions J21A and J21B are parallel to each other and so as to be disposed on the same straight line extending in the direction corresponding to the magnetization lines J21A and J21B of the pinned layers. The third and fourth magnetic sensing devices 10C and 10D are formed on the second substrate 42 so that the magnetization directions J21C and J21D are parallel to each other and so as to be disposed in the same straight line extending in the direction corresponding to the magnetization directions J21C and J21D of the pinned layers. In the second modification, all of the magnetization directions J21A to J21D are the same direction (+Y direction). With such a configuration, reduction in cost can be realized more easily than the case of forming the four magnetic sensing devices 10A to 10D in a lump on a single substrate since it is sufficient to form a plurality of magnetic sensing devices on a single wafer, cut a substrate (for example, the first or second substrate 41 or 42) having two magnetic sensing devices as a unit, and properly dispose the substrates at predetermined intervals. In this way, a wasted space can be eliminated more than the case of forming four magnetic sensing devices in a lump on a single substrate, and a number of magnetic sensing devices can be formed on a single wafer.

In the case of the second modification, as shown in FIG. 12, the magnetic field H+ in the +X direction in the magnetic field (external magnetic field) to be sensed which is generated by the current I to be sensed can be sensed by the first module 11, and the magnetic field H− in the −X direction can be sensed by the second module 12.

Third Modification

Figure 13:
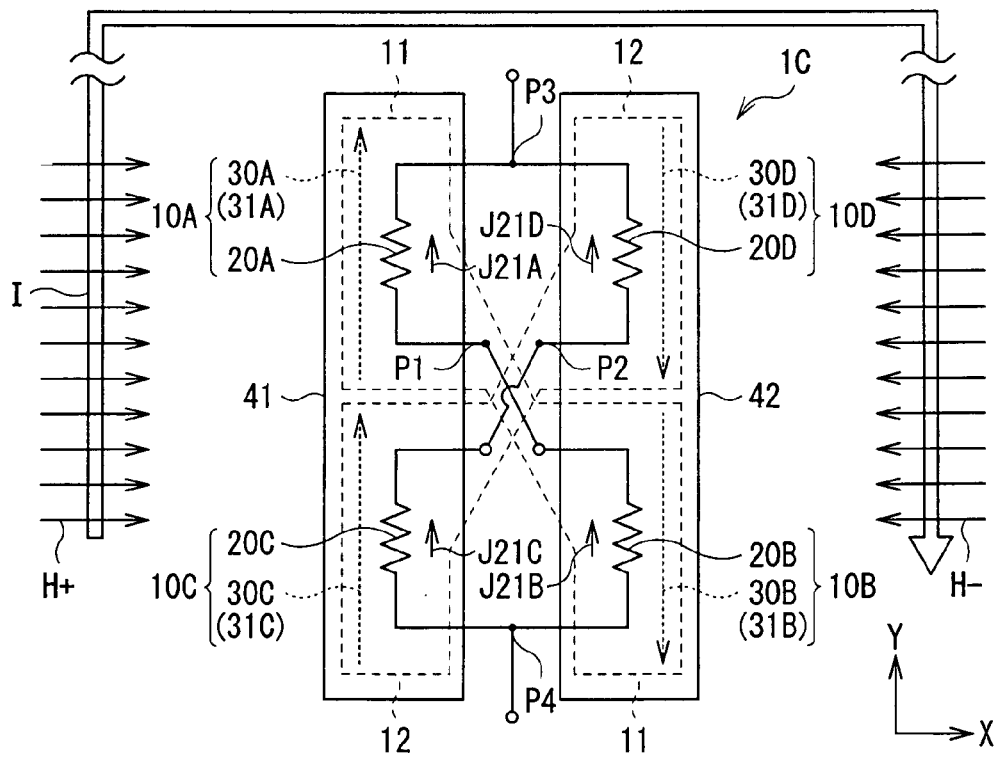
FIG. 13 is a schematic diagram showing a third modification of the magnetic sensor illustrated in FIG. 9.

FIG. 13 shows the configuration of a magnetic sensor 1C as a third modification. In the second modification, the first module 11 is formed on the first substrate 41, the second module 12 is formed on the second substrate 42, and the first and second modules 11 and 12 are connected in parallel. In the third modification, two magnetic sensing devices formed on different substrates are connected in series to form a single magnetic sensing module, and two magnetic sensing modules are connected in parallel, thereby constructing a bridge circuit. Concretely, in the third modification, the first and third magnetic sensing devices 10A and 10C are formed on the first substrate 41, and the second and fourth magnetic sensing devices 10B and 10D are formed on the second substrate 42. More specifically, the first and third magnetic sensing devices 10A and 10C are disposed on the same straight line so that the magnetization directions J21A and J21C of the pinned layers become parallel to each other. The second and fourth magnetic sensing devices 10B and 10D are disposed on the same straight line so that the magnetization directions J21B and J21D of the pinned layer become parallel to each other. In particular, in the third modification, all of the magnetization directions J21A to J21D are the same direction (+Y direction). In the magnetic sensor 1C, in place of forming the bridge circuit in the shape of eight, the bias current line 30 can be formed in a loop shape.

Fourth Modification

Figure 14:
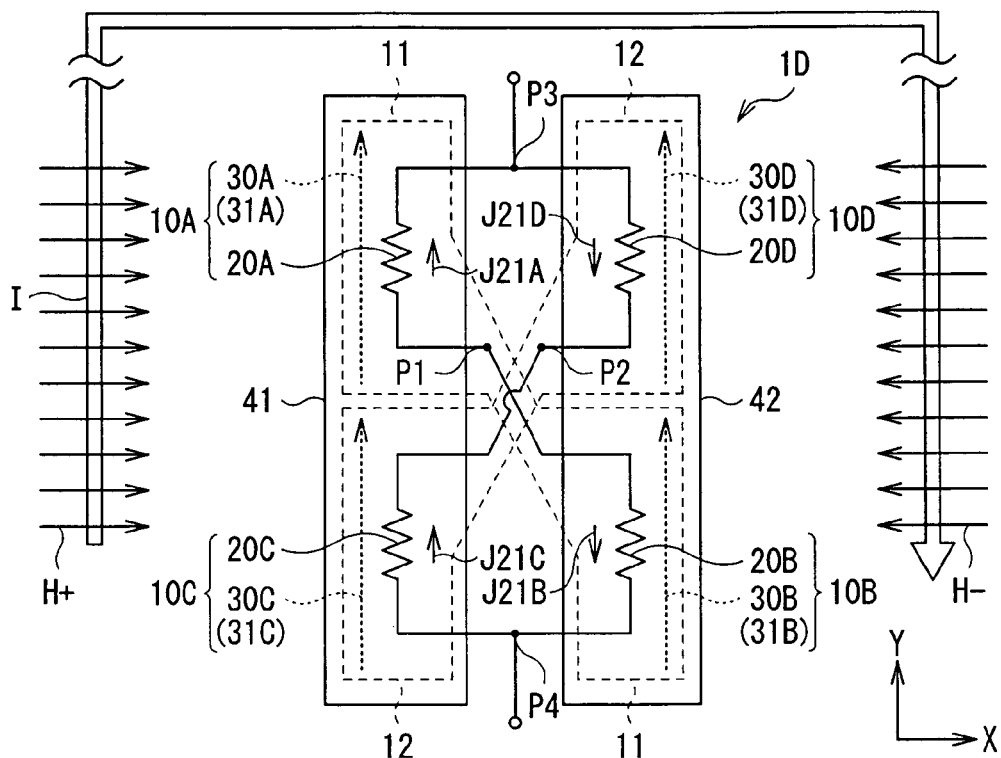
FIG. 14 is a schematic diagram showing a fourth modification of the magnetic sensor illustrated in FIG. 9.

FIG. 14 shows the configuration of a magnetic sensor 1D as a fourth modification. In the configuration example, like the magnetic sensor 1C of the third modification, two magnetic sensing devices formed on different substrates are connected in series to form a single magnetic sensing module, and two magnetic sensing modules are connected in parallel, thereby constructing a bridge circuit. In the fourth modification, the magnetization directions J21A and J21C are opposite to the magnetization directions J21B and J21D. In the magnetic sensor 1D, all of the directions of the bias currents 30A to 30D can be aligned in one direction.

Fifth Modification

Figure 15:
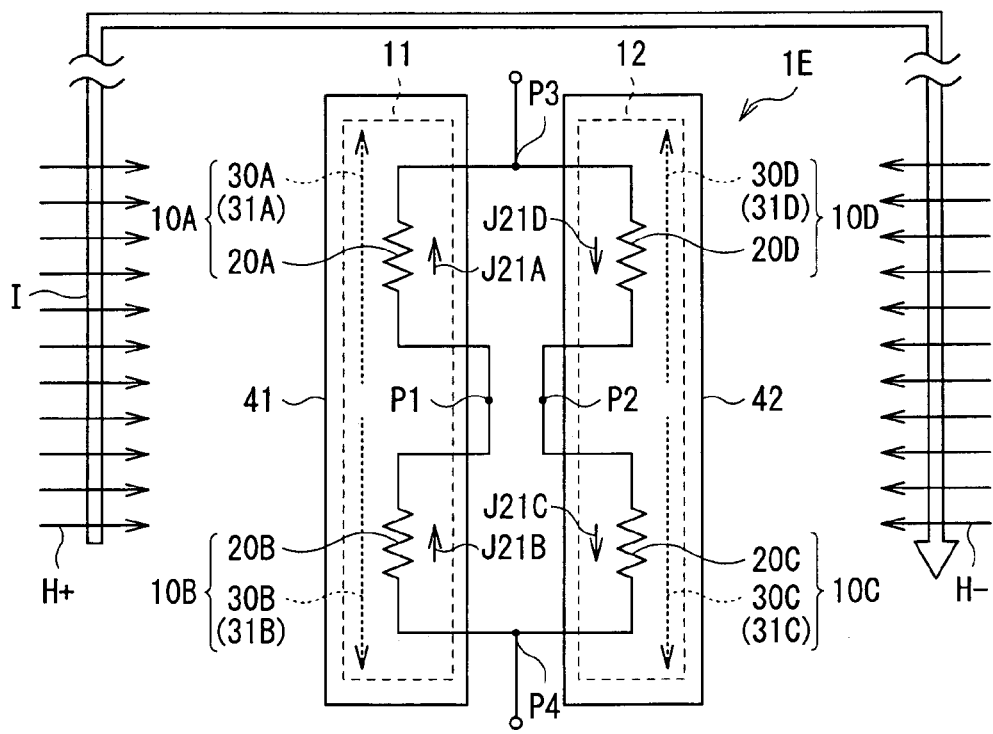
FIG. 15 is a schematic diagram showing a fifth modification of the magnetic sensor illustrated in FIG. 9.

FIG. 15 shows the configuration of a magnetic sensor 1E as a fifth modification. In the configuration example, like the magnetic sensor 1B of the second modification, by connecting the first module 11 formed on the first substrate 41 and the second module 12 formed on the second substrate 42, a bridge circuit is formed. In the fifth modification, however, the magnetization directions J21A and J21B are the +Y direction and the magnetization directions J21C and J21D are −Y direction, so that the directions are opposite to each other. The magnetic sensor 1E has a configuration placing importance on symmetry. The first module 11 formed on the first substrate 41 and the second module 12 formed on the second substrate 42 have the same configuration.

In the embodiment and first to fifth modifications, the cases of applying the bias magnetic field Hb is applied by the bias current line 30 has been described. However, the invention is not limited to the cases. For example, the bias magnetic field Hb may be applied by using a permanent magnet made of hard ferrite or the like. In the case where the bias current line is provided, there is an advantage such that the direction of the bias magnetic field can be switched more easily by changing the current direction. On the other hand, in the case of disposing a permanent magnet, a power source for passing the bias current is unnecessary.

Sixth Modification

Figure 16:
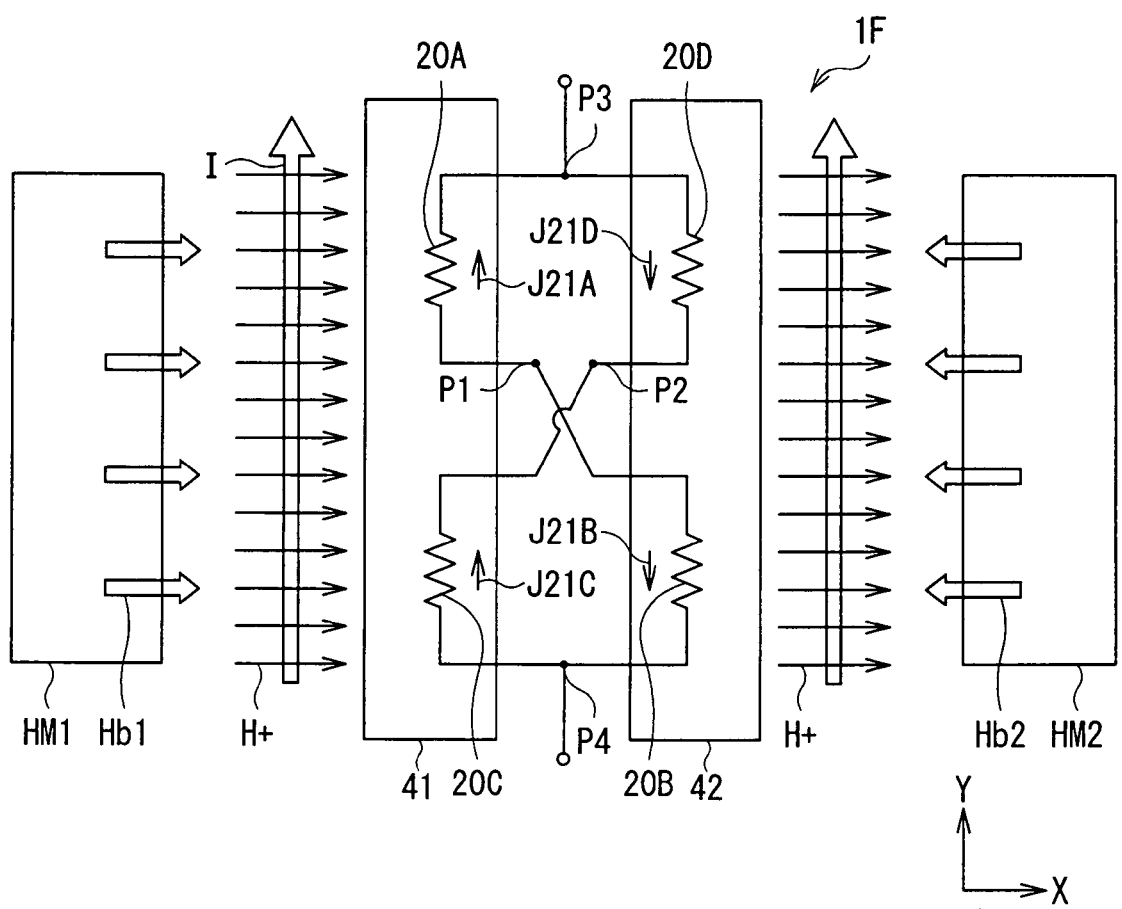
FIG. 16 is a schematic diagram showing a sixth modification of the magnetic sensor illustrated in FIG. 9.

FIG. 16 shows the configuration of a magnetic sensor 1F as a sixth modification. The magnetic sensor 1F has two permanent magnets HM1 and HM2 as bias applying means. The permanent magnet HM1 applies the bias magnetic field Hb1 in the +X direction to the stacked bodies 20A and 20C, and the permanent magnet HM2 applies the bias magnetic field Hb2 in the −X direction to the stacked bodies 20B and 20D. Therefore, the permanent magnet HM1 constructs the magnetic sensing device 10A in cooperation with the stacked body 20A and constructs the magnetic sensing device 10C in cooperation with the stacked body 20C. The other permanent magnet HM2 constructs the magnetic sensing device 10B in cooperation with the stacked body 20B and constructs the magnetic sensing device 10D in cooperation with the stacked body 20D. In the sixth modification, two equal currents I are passed in the same direction (+Y direction). In this case, the external magnetic field H+ in the +X direction is applied to all of the stacked bodies 20A to 20D. Consequently, by setting the magnetization directions J21A to J21D as shown in the diagram, the current I can be measured.

Seventh Modification

Figure 17:
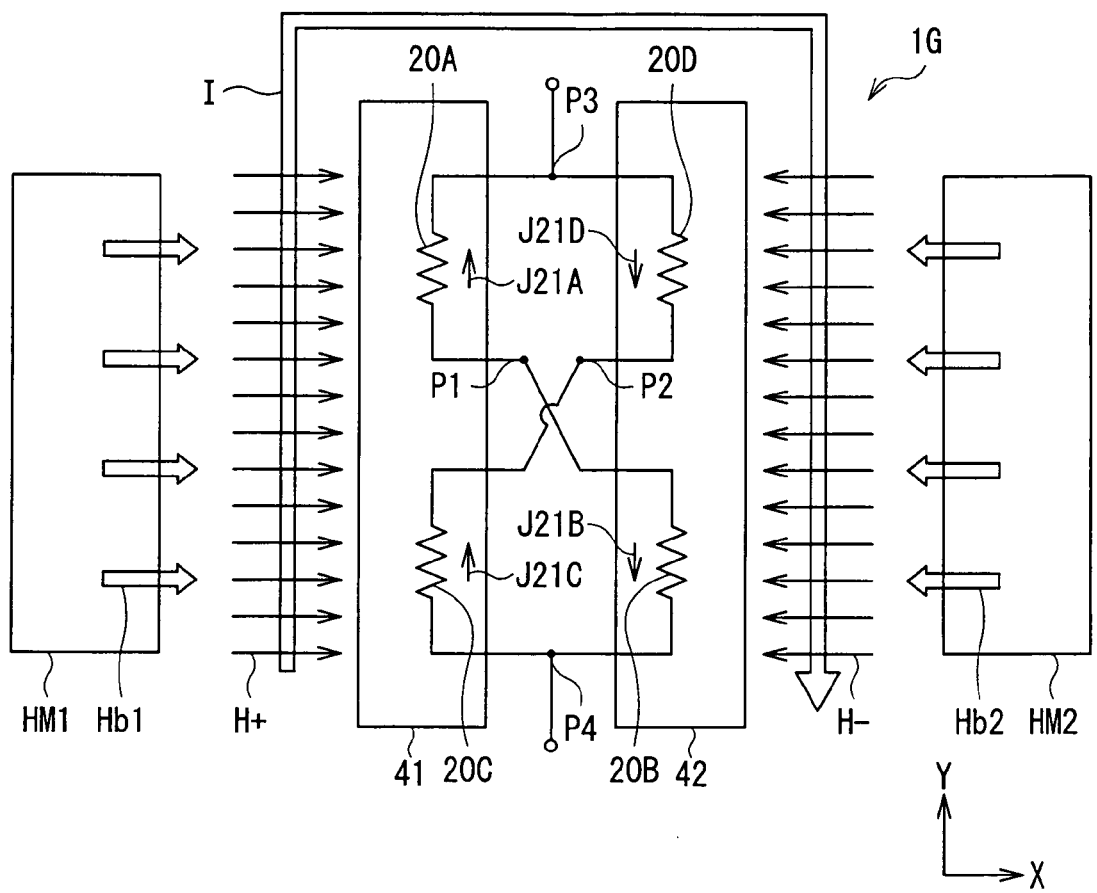
FIG. 17 is a schematic diagram showing a seventh modification of the magnetic sensor illustrated in FIG. 9.

FIG. 17 shows the configuration of a magnetic sensor 1G as a seventh modification. The magnetic sensor 1G has two permanent magnets HM1 and HM2 as bias applying means as well as the sixth modification. In the seventh modification, the magnetic sensor 1G is constructed so that the current I flows in a loop shape. Concretely, the current I flows in the +Y direction around the stacked bodies 20A and 20C and flows in the −Y direction around the stacked bodies 20B and 20D. Consequently, the external magnetic field H+ in the +X direction is applied to the stacked bodies 20A and 20C, and the external magnetic field H− in the −X direction is applied to the stacked bodies 20B and 20D. In this case, by setting the magnetization directions J21A to J21D as described in the diagram, the current I can be measured.

As described above, in the seventh modification, the bridge circuit is constructed by the first to fourth magnetic sensing devices 10 each having: the stacked body 20 including the pinned layer 21 whose magnetization direction is pinned in one direction, the free layer 23 whose magnetization direction J23 changes according to the external magnetic field H and, when the external magnetic field H is zero, becomes parallel to the magnetization direction J21 of the pinned layer 21, and the intermediate layer 22 sandwiched between the pinned layer 21 and the free layer 23; and the bias current line 30 for applying the bias magnetic field Hb to the stacked body 20 in the direction orthogonal to the magnetization direction J21. The first to fourth magnetic sensing devices 10 sense the external magnetic field H generated by the current I flowing in parallel to or anti-parallel to the magnetization direction J21. Thus, the current I can be stably sensed with high sensitivity. In particular, the value of the current I itself can be continuously and accurately sensed, so that the invention is suitable for sensing not only a digital signal but also an analog signal.

As compared with the case of using an AMR element using the anisotropic magneto-resistive (AMR) effect, the magnetic sensing device 10 as the GMR element has the following advantages. First, the magnetic sensing device 10 can obtain the same output as that of the AMR element in spite of the fact that the size of the magnetic sensing device 10 is as small as about 1/20 of the AMR element. Since the size of each of the magnetic sensing devices 10 is small, the dimensions of the magnetic sensor 1 constructed by using the magnetic sensing devices 10 can be also naturally small. The resistance change rate is about 2.5 times as high as that of the AMR element. Further, also in a manufacturing process, the area for forming each magnetic sensing device 10 can be reduced. Thus, as compared with the AMR element, a larger number of the magnetic sensing devices 10 can be formed on a single wafer.

When a bridge circuit is constructed by cutting out two magnetic sensing devices as a substrate and combining two substrates as shown in the second to seventh modifications, reduction in cost can be achieved more easily than constructing a bridge circuit by forming four magnetic sensing devices 10 in a lump on a single substrate. In this case, the configuration of the magnetic sensor 1B shown in FIG. 12 is more preferable than the configuration of the magnetic sensor 1C shown in FIG. 13 for the reason that the configuration of the magnetic sensor 1B is less influenced by the substrate temperature. In the case of forming one module (having two magnetic sensing devices) on the same substrate, the influences of the substrate temperatures with respect to the resistance value are cancelled out each other.

Although the invention has been described above by some embodiments, the invention is not limited to the embodiments but may be variously modified. For example, although the case of sensing the analog signal magnetic field generated by the current flowing in a conductor has been described in the embodiments, the invention is not limited to the embodiments. For example, the magnetic sensing device of the invention can be also applied for sensing a digital signal magnetic field like a thin film magnetic head.

Figure 18:
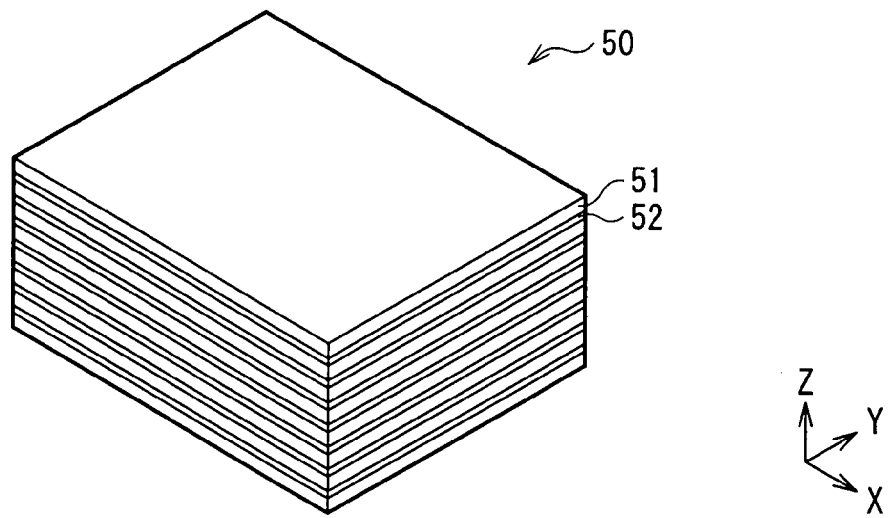
FIG. 18 is a cross section showing another configuration example of the stacked body as a component of the magnetic sensing device illustrated in FIGS. 1A to 1C.
Figure 19:
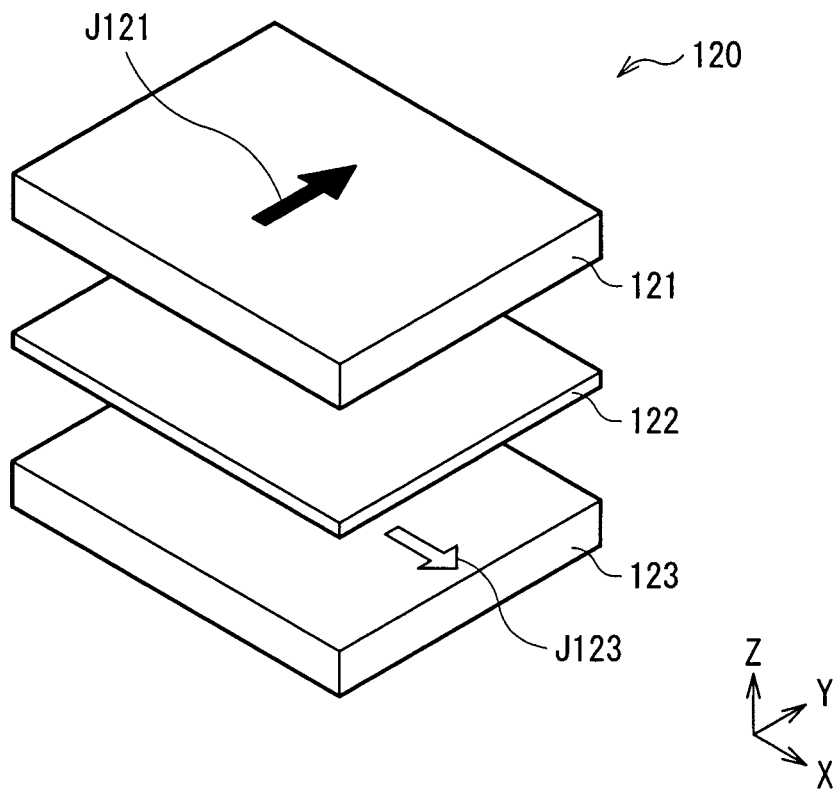
FIG. 19 is an exploded perspective view showing the configuration of a conventional stacked body having a spin valve structure.
Figure 20:
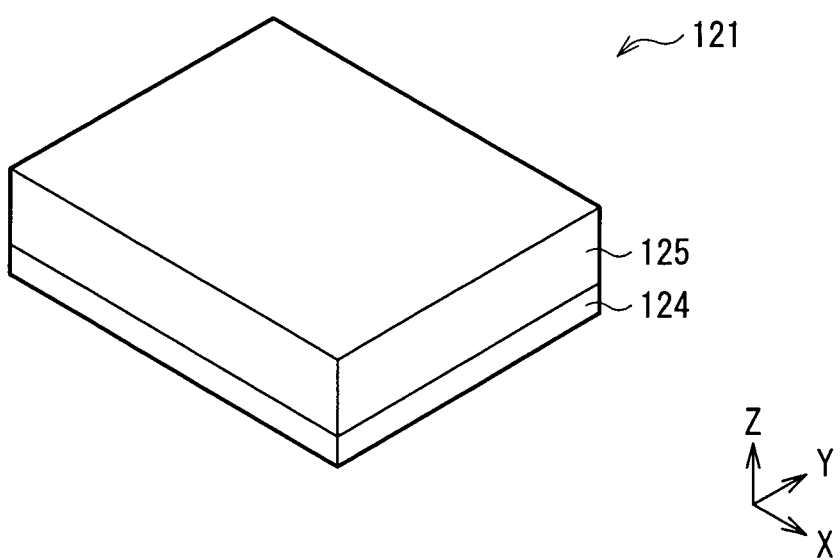
FIG. 20 is a perspective view showing a detailed configuration of a part of the stacked body illustrated in FIG. 19.
Figure 21:
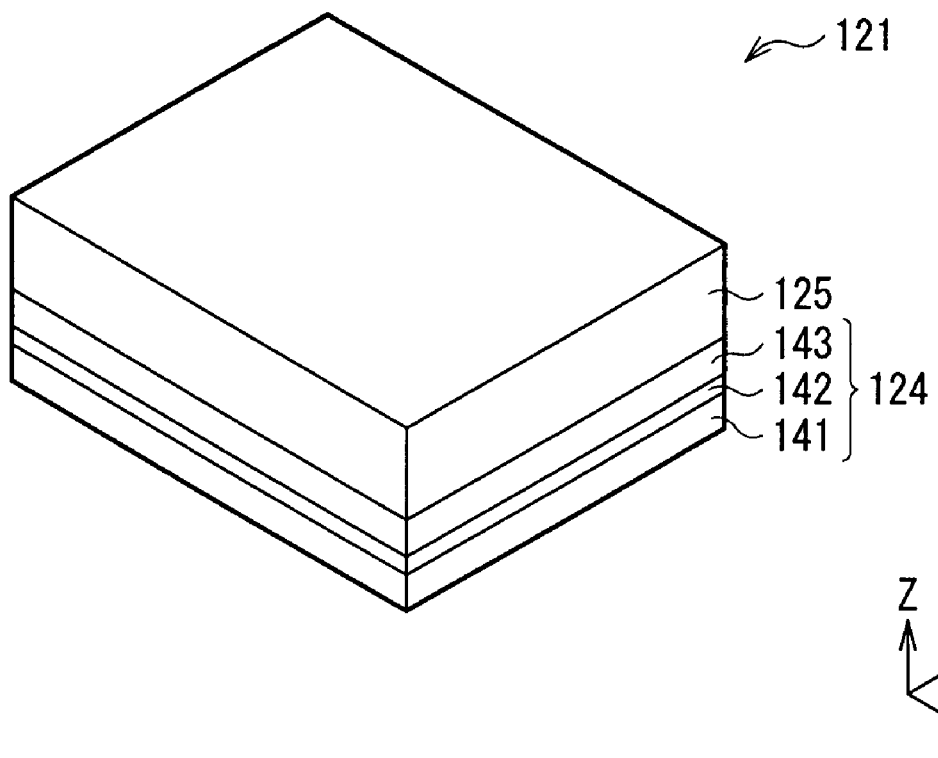
FIG. 21 is a perspective view showing a more detailed configuration of a part of the stacked body illustrated in FIG. 19.
Figure 22:
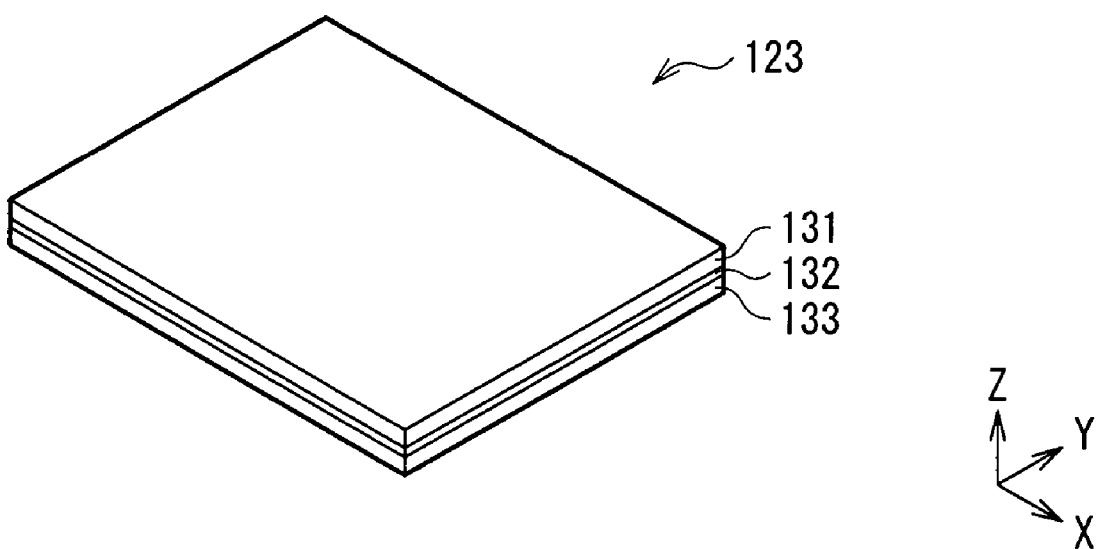
FIG. 22 is a perspective view showing a detailed configuration of another part of the stacked body illustrated in FIG. 19.
Figure 23A:
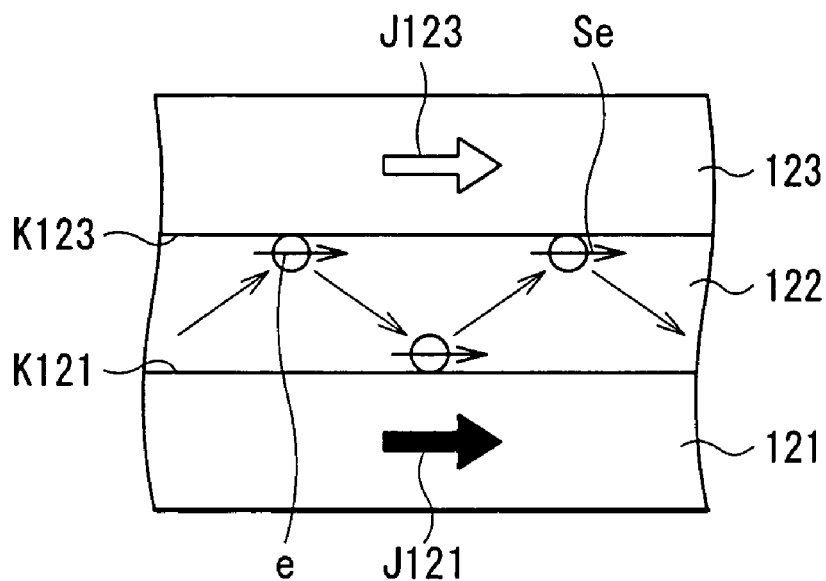
FIGS. 23A and 23B are diagrams for explaining the action of a general GMR effect.
Figure 23B:
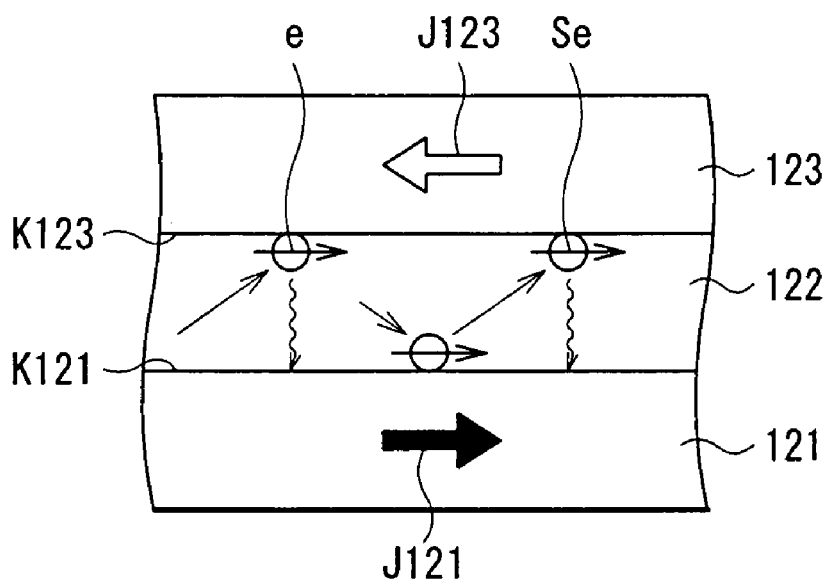
Figure 24A:
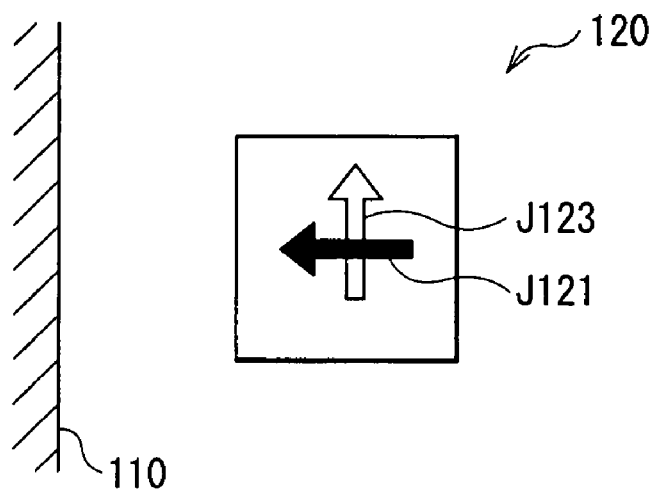
FIGS. 24A to 24C are diagrams for explaining the operation of a thin film magnetic head in which the stacked body shown in FIG. 19 is mounted.
Figure 24B:
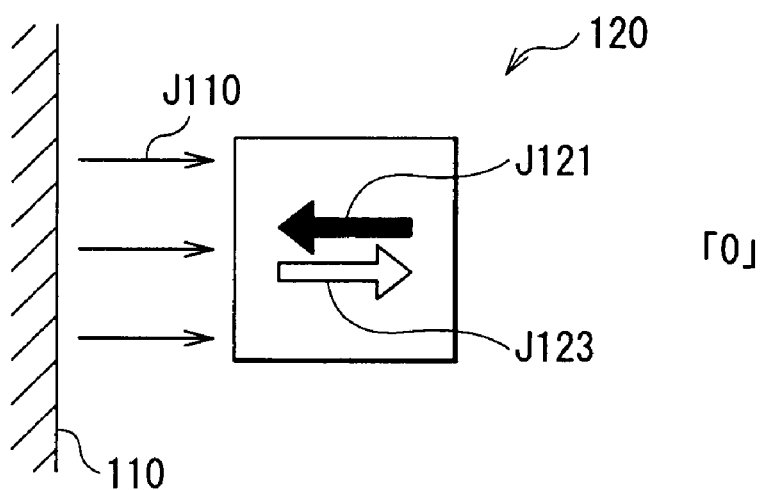
Figure 24C:
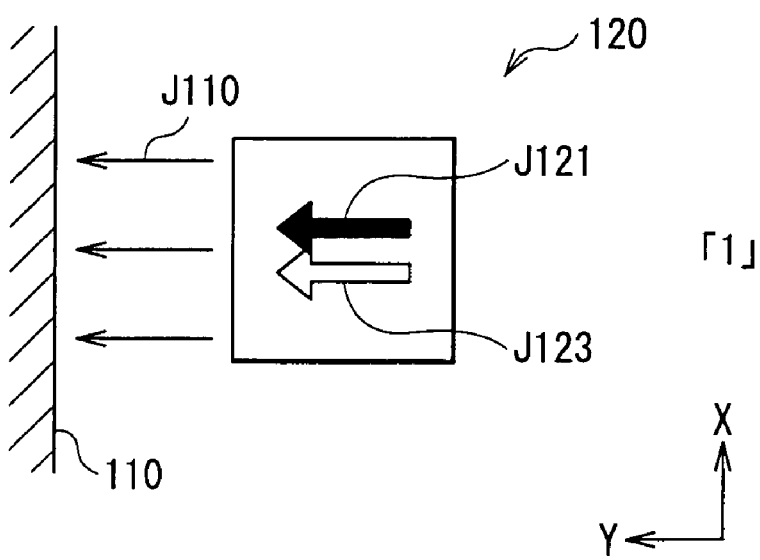
Figure 25:
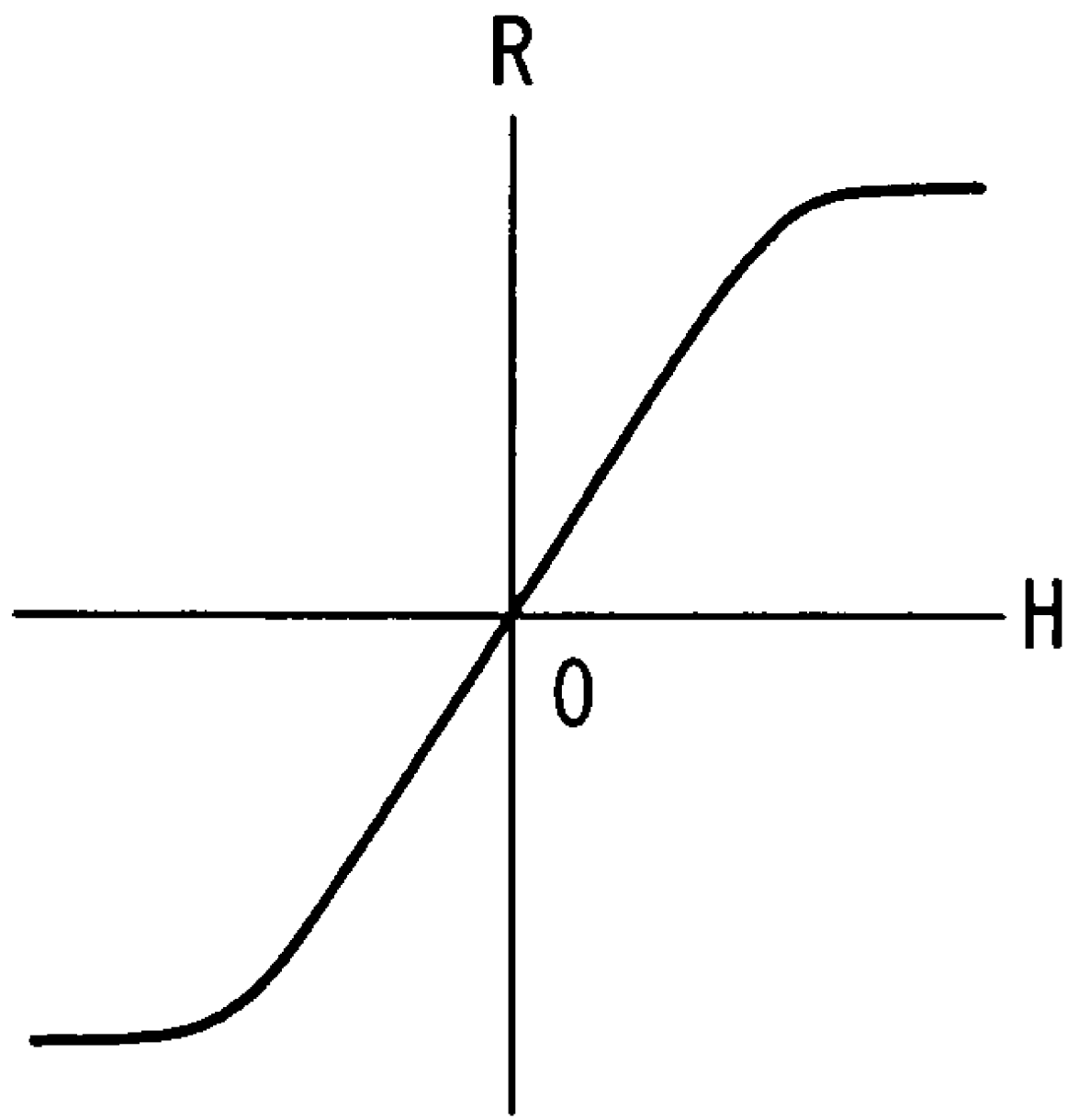
FIG. 25 is a characteristic diagram showing the relation between an external magnetic field (signal magnetic field) and electric resistance in the stacked body illustrated in FIG. 19.
Figure 26A:
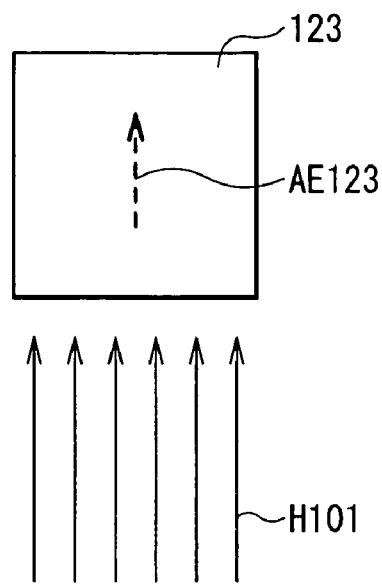
FIGS. 26A to 26C are conceptual diagrams showing a process of forming the stacked body illustrated in FIG. 19.
Figure 26B:
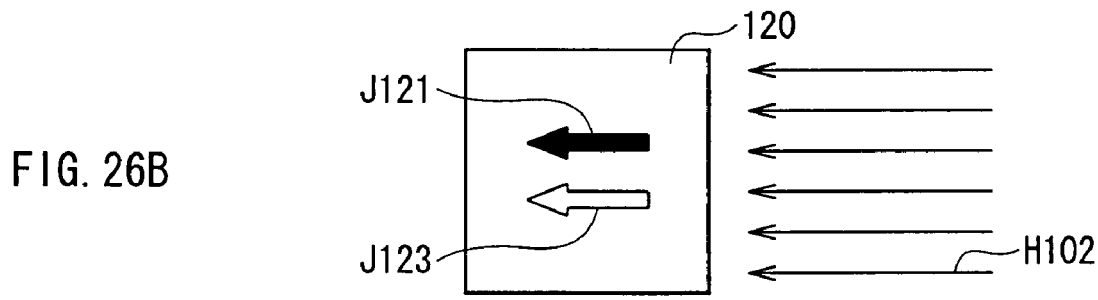
Figure 26C:
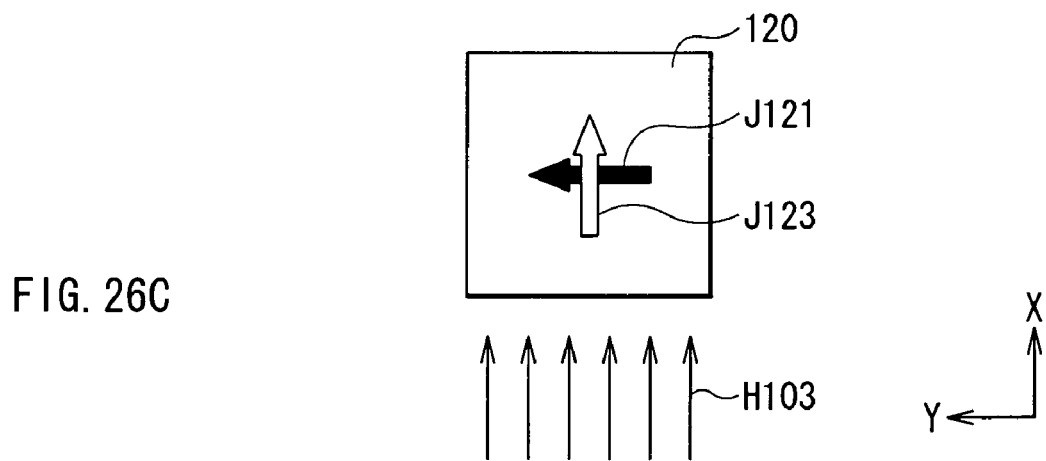
Figure 27:
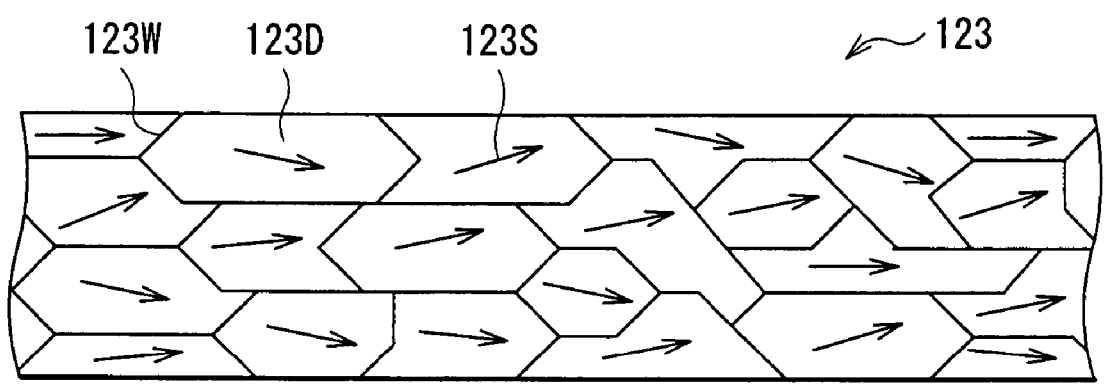
FIG. 27 is a conceptual diagram schematically showing a spin direction distribution in the free layer of the stacked body illustrated in FIG. 19.
Figure 28:
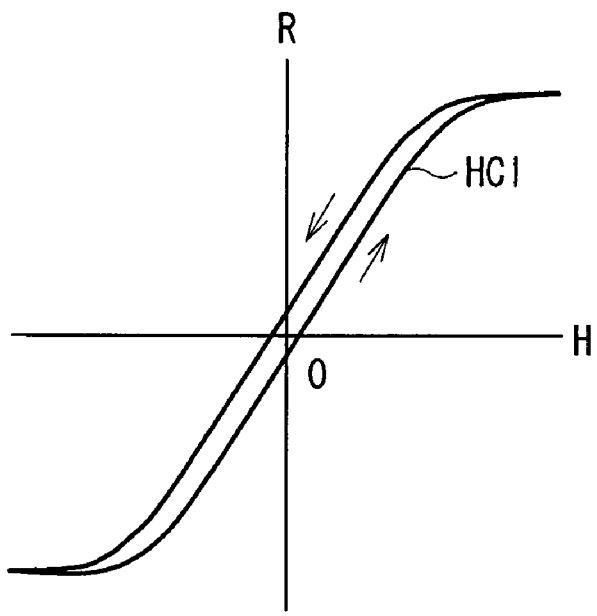
FIG. 28 is a characteristic diagram showing magnetic field dependency of resistance change in the stacked body illustrated in FIG. 19.
Figure 29:
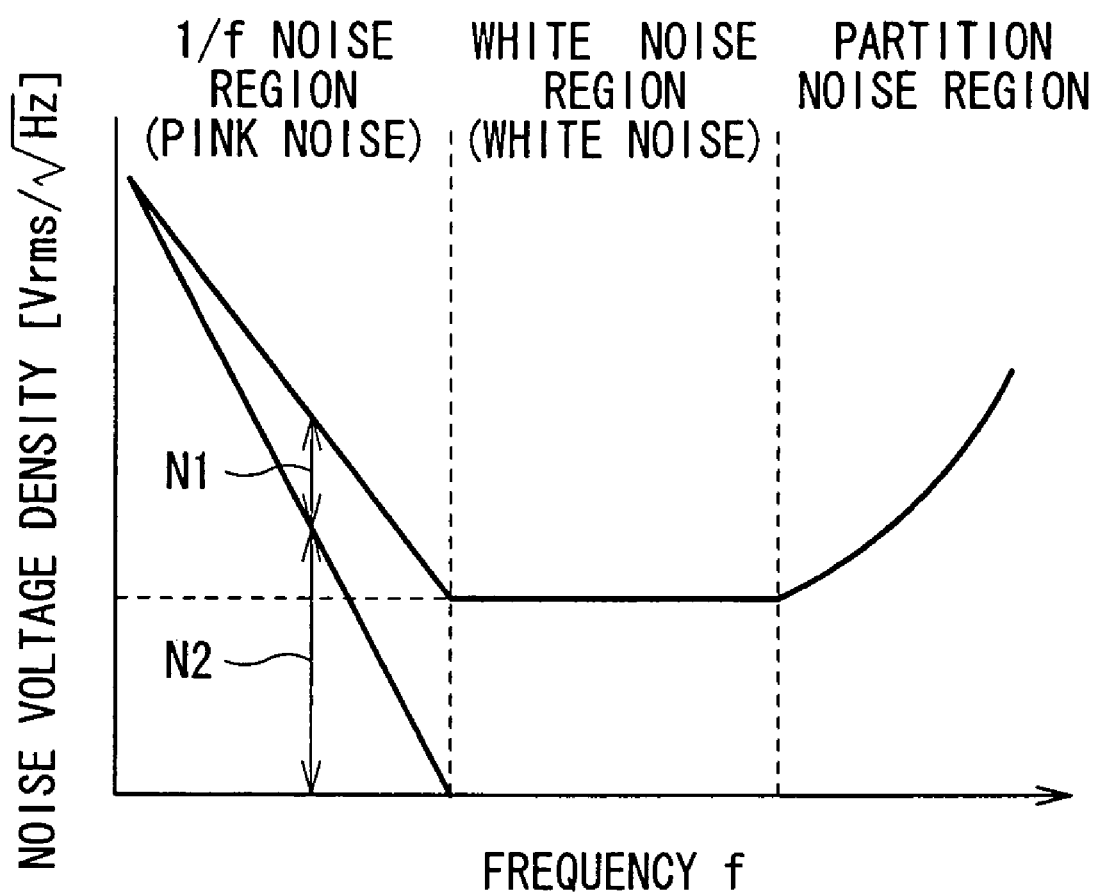
FIG. 29 is a characteristic diagram showing frequency dependency of noise which occurs in the stacked body illustrated in FIG. 19.

The configuration of the stacked body is not limited to that in the foregoing embodiments. The stacked body may have a multilayer structure like a stacked body 50 shown in FIG. 18 in which a plurality of ferromagnetic thin films 51 made of at least one of nickel iron alloy, cobalt, cobalt iron alloy, and cobalt chrome alloy and a plurality of non-magnetic films 52 made of copper, gold, silver, or the like are alternately stacked.

Further, in the embodiments, the case where two magnetic sensing devices out of four magnetic sensing devices constructing the magnetic sensor have the magnetization directions of the pinned layers parallel to each other and are disposed on the same straight line extending in the direction corresponding to the magnetization directions has been described. However, the invention is not limited to the case. Two magnetic sensing devices may not be disposed on the same straight line extending in the direction corresponding to the magnetization direction of the pinned layer, and the magnetization directions of the pinned layers may be not parallel to each other.

As described above in the foregoing embodiments, the magnetic sensing device, magnetic sensor, and ammeter of the invention are used for measuring a current value itself and also can be applied for an eddy current examination technique for conducting a test to find a defect in print wiring or the like. An example of application is a line sensor obtained by disposing a number of magnetic sensing devices on a straight line, which detects a change in eddy current as a change in a magnetic flux.

Obviously many modifications and variations of the present invention are possible in the light of the above teachings. It is therefore to be understood that within the scope of the appended claims, the invention may be practiced otherwise than as specifically described.

What is claimed is:

1. A magnetic sensing device comprising a stacked body including:
    a pinned layer having a magnetization direction pinned in a predetermined direction;
    a free layer having a magnetization direction, the free layer configured so that the free layer magnetization direction changes according to an external magnetic field and, when the external magnetic field is zero, is parallel to the magnetization direction of the pinned layer; and
    an intermediate layer sandwiched between the pinned layer and the free layer.

2. The magnetic sensing device according to claim 1, wherein the free layer has an easy axis of magnetization parallel to the magnetization direction of the pinned layer.

3. The magnetic sensing device according to claim 1, further comprising bias applying means for applying a bias magnetic field to the stacked body in a direction orthogonal to the magnetization direction of the pinned layer.

4. The magnetic sensing device according to claim 3, wherein the bias applying means is either a permanent magnet or a bias current line extending in the magnetization direction of the pinned layer.

5. A magnetic sensor comprising:
    a first magnetic sensing module including first and second magnetic sensing devices connected to each other at a first connection point; and
    a second magnetic sensing module including third and fourth magnetic sensing devices connected to each other at a second connection point,
    wherein:
    the first and second magnetic sensing modules construct a bridge circuit in which an end on the side opposite to the first connection point in the first magnetic sensing device and an end on the side opposite to the second connection point in the fourth magnetic sensing device are connected to each other at a third connection point, an end on the side opposite to the first connection point in the second magnetic sensing device and an end on the side opposite to the second connection point in the third magnetic sensing device are connected to each other at a fourth connection point, configured so that when a voltage is applied across the third and fourth connection points, an output is detected at the first and second connection points, and each of the first to fourth magnetic sensing devices comprises:

a stacked body including:
   a pinned layer having a magnetization direction pinned in a predetermined direction,
   a free layer having a magnetization direction, the free layer configured so that the free layer magnetization direction changes according to an external magnetic field and, when the external magnetic field is zero, is parallel to the magnetization direction of the pinned layer, and
   an intermediate layer sandwiched between the pinned layer and the free layer; and bias applying means for applying a bias magnetic field to the stacked body in the direction orthogonal to the magnetization direction of the pinned layer.

6. The magnetic sensor according to claim 5, wherein the free layer has an easy axis of magnetization parallel to the magnetization direction of the pinned layer.

7. The magnetic sensor according to claim 5, wherein the bias applying means is either a permanent magnet or a bias current line extending in the magnetization direction of the pinned layer.

8. The magnetic sensor according to claim 5, wherein the magnetization directions of the pinned layers of the first and second magnetic sensing devices are parallel to each other, and the magnetization directions of the pinned layers of the third and fourth magnetic sensing devices are parallel to each other.

9. The magnetic sensor according to claim 8, wherein the first and second magnetic sensing devices are disposed on a straight line extending in a direction corresponding to the magnetization directions of the pinned layers of the first and second magnetic devices, and the third and fourth magnetic sensing devices are disposed on a straight line extending in a direction corresponding to the magnetization directions of the pinned layers of the third and fourth magnetic sensing devices.

10. The magnetic sensor according to claim 8, wherein the first and second magnetic sensing devices are disposed on a first substrate, and the third and fourth magnetic sensing devices are disposed on a second substrate different from the first substrate.

11. The magnetic sensor according to claim 5, wherein the magnetization directions of the pinned layers of the first and third magnetic sensing devices are parallel to each other, and the magnetization directions of the pinned layers of the second and fourth magnetic sensing devices are parallel to each other.

12. The magnetic sensor according to claim 11, wherein the first and third magnetic sensing devices are disposed on a straight line extending in a direction corresponding to the magnetization directions of the pinned layers of the first and third magnetic sensing devices, and the second and fourth magnetic sensing devices are disposed on a straight line extending in a direction corresponding to the magnetization directions of the pinned layers of the second and fourth magnetic sensing devices.

13. The magnetic sensor according to claim 11, wherein the first and third magnetic sensing devices are disposed on a first substrate, and the second and fourth magnetic sensing devices are disposed on a second substrate different from the first substrate.

14. An ammeter for measuring current to be sensed, by sensing a magnetic field generated by the current to be sensed, comprising:

a first magnetic sensing module including first and second magnetic sensing devices connected to each other at a first connection point; and a second magnetic sensing module including third and fourth magnetic sensing devices connected to each other at a second connection point, wherein:

the first and second magnetic sensing modules construct a bridge circuit in which an end on the side opposite to the first connection point in the first magnetic sensing device and an end on the side opposite to the second connection point in the fourth magnetic sensing device are connected to each other at a third connection point, an end on the side opposite to the first connection point in the second magnetic sensing device and an end on the side opposite to the second connection point in the third magnetic sensing device are connected to each other at a fourth connection point, configured so that when a voltage is applied across the third and fourth connection points, an output is detected at the first and second connection points, each of the first to fourth magnetic sensing devices comprises:

a stacked body including:
   a pinned layer having a magnetization direction pinned in a predetermined direction,
   a free layer having a magnetization direction, the free layer configured so that the free layer magnetization direction changes according to an external magnetic field and, when the external magnetic field is zero, is parallel to the magnetization direction of the pinned layer, and
   an intermediate layer sandwiched between the pinned layer and the free layer; and bias applying means for applying a bias magnetic field to the stacked body in the direction orthogonal to the magnetization direction of the pinned layer, and a magnetic field generated by the current to be sensed is sensed by each of the first to fourth magnetic sensing devices.

15. The ammeter according to claim 14, wherein the current to be sensed flows in parallel or anti-parallel to the magnetization direction of the pinned layer.

16. A method of forming a magnetic sensing device, comprising: a stacking step of forming a stacked body by sequentially forming a free layer comprising a first ferromagnetic layer whose magnetization direction changes according to an external magnetic field, an intermediate layer, and a pinned layer comprising a second ferromagnetic layer having coercive force larger than that of the first ferromagnetic layer; and a regularization step of making regularization so that the magnetization directions of the free layer and the pinned layer become parallel to each other, wherein the magnetization directions of the free layer and the pinned layer are set to be parallel to each other in an initial state where the external magnetic field is zero by the regularization step.

17. The method of forming a magnetic sensing device according to claim 16, wherein the first ferromagnetic layer is formed so as to have an easy axis of magnetization, and regularization is made so that the magnetization directions of the first and second ferromagnetic layers become parallel to the easy axis of magnetization.

18. The method of forming a magnetic sensing device according to claim 17, wherein the direction of the easy axis of magnetization is set by forming the first ferromagnetic layer while applying a magnetic field in a predetermined direction.

19. A method of forming a magnetic sensing device according to claim 16, wherein regularization is made by performing an annealing process at a temperature in a range from 250° C. to 400° C. while applying a magnetic field in a range from 1.6 kA/m to 160 kA/m.

* * * * *